United States Patent
Hwang et al.

(10) Patent No.: US 8,592,269 B2
(45) Date of Patent: Nov. 26, 2013

(54) METHOD OF MANUFACTURING GATE STRUCTURE AND METHOD OF MANUFACTURING SEMICONDUCTOR DEVICE INCLUDING THE SAME

(75) Inventors: Ki-Hyun Hwang, Seongnam-si (KR); Won-Jun Jang, Seoul (KR); Jae-Young Ahn, Seoul (KR); Chang-Sup Mun, Suwon-si (KR); Jung-Hyun Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 86 days.

(21) Appl. No.: 12/942,107

(22) Filed: Nov. 9, 2010

(65) Prior Publication Data

US 2011/0053365 A1 Mar. 3, 2011

Related U.S. Application Data

(62) Division of application No. 11/490,154, filed on Jul. 21, 2006, now abandoned.

(30) Foreign Application Priority Data

Jul. 22, 2005 (KR) .................. 2005-66674

(51) Int. Cl.
*H01L 21/8238* (2006.01)
(52) U.S. Cl.
USPC ........................ 438/201; 438/216; 257/321
(58) Field of Classification Search
CPC .............. H01L 21/3205; H01L 21/32105; H01L 29/66825; H01L 29/66833; H01L 29/788; H01L 29/42324; H01L 29/42328; H01L 29/4234

USPC ............ 257/315, 321, E21.18, E21.422, 257/E21.179, E29.3; 438/142, 197, 199, 438/201, 216

See application file for complete search history.

(56) References Cited

U.S. PATENT DOCUMENTS

| | | | |
|---|---|---|---|
| 5,393,686 A | 2/1995 | Yeh et al. | |
| 5,563,093 A | 10/1996 | Koda et al. | |
| 6,391,722 B1 * | 5/2002 | Koh | 438/264 |
| 6,723,581 B1 * | 4/2004 | Chabal et al. | 438/104 |
| 6,864,396 B2 | 3/2005 | Smith et al. | |
| 6,924,219 B1 | 8/2005 | Chu et al. | |
| 7,250,085 B2 | 7/2007 | Abbadie et al. | |
| 2001/0044215 A1 * | 11/2001 | Takahashi | 438/725 |
| 2005/0287717 A1 | 12/2005 | Heald et al. | |
| 2006/0046383 A1 * | 3/2006 | Chen et al. | 438/257 |
| 2009/0065057 A1 | 3/2009 | Marder et al. | |
| 2009/0065764 A1 | 3/2009 | Heald et al. | |

FOREIGN PATENT DOCUMENTS

| | | |
|---|---|---|
| JP | 2003209066 A | 7/2003 |
| KR | 1020030057177 A | 7/2003 |
| KR | 1020040057716 A | 7/2004 |

OTHER PUBLICATIONS

Korean Pub. 10-2004-0057716 "Method for forming dual gate-oxide", Cho et al. (Jul. 2, 2004), Machine English Translation.

* cited by examiner

*Primary Examiner* — Khiem D Nguyen
(74) *Attorney, Agent, or Firm* — Volentine & Whitt, PLLC

(57) ABSTRACT

In a method for manufacturing a semiconductor device, a silicon oxide layer is formed on a substrate. The silicon oxide layer is treated with a solution comprising ozone. Then, a conductive layer is formed on the silicon oxide layer treated with the solution.

16 Claims, 18 Drawing Sheets

METHOD OF MANUFACTURING GATE STRUCTURE AND METHOD OF MANUFACTURING SEMICONDUCTOR DEVICE INCLUDING THE SAME

CROSS-REFERENCE TO RELATED APPLICATION

This is a divisional of application Ser. No. 11/490,154 filed on Jul. 21, 2006, which is incorporated herein by reference in its entirety, and is now abandoned.

BACKGROUND OF THE INVENTION

1. Field of the Invention

Embodiments of the present invention relate generally to a method of manufacturing a gate structure and a method of manufacturing a semiconductor device including the same. More particularly, embodiments of the invention relate to a method of manufacturing a gate structure using a surface treatment involving a solution comprising ozone, and a method of manufacturing a semiconductor device including the same.

A claim of priority is made to Korean Patent Application No. 2005-0066674, filed on Jul. 22, 2005, the disclosure of which is hereby incorporated by reference in its entirety.

2. Description of Related Art

Semiconductor memory devices can be broadly classified into volatile semiconductor memory devices and non-volatile semiconductor memory devices. Volatile memory devices lose stored data when disconnected from a power source, while non-volatile memory devices maintain stored data when disconnected from power. Examples of volatile semiconductor memory devices include static random access memory (SRAM) devices and dynamic random access memory (DRAM) devices, and examples of non-volatile semiconductor memory devices include erasable programmable read only memory (EPROM), electrically erasable programmable read only memory (EEPROM) and flash memory.

There is a continuing trend for semiconductor devices to become increasingly integrated, and for their design rule to decrease. With this trend, semiconductor devices have had to undergo a variety of changes. For example, when forming a DRAM device having a storage capacity of a gigabyte, a lower operating power and a finer line width are required. Thus, in a DRAM cell, a gate conductive layer of a transistor has a thickness less than about 100 Å. In order to form the thin gate conductive layer uniformly and stably, a gate oxide layer under the gate conductive layer must be treated properly.

Similarly, a memory cell of a non-volatile semiconductor memory device, as a line width of a gate structure is reduced, the thickness of a floating gate in the gate structure is reduced. For example, where the line width of the gate structure is about 90 nm, the thickness of the floating gate is about 8 nm; where the line width is about 65 nm, the thickness is about 6 nm; and where the line width is about 45 nm, the thickness is about 3 nm. However, where the thickness of the floating gate becomes less than about 6 nm, a leakage current of the floating gate may increase beyond a permissible range. In other words, as the thickness of the floating gate drops below a critical level, it becomes increasingly difficult to maintain stored charge therein. As a result, the non-volatile semiconductor memory device may not operate properly.

As non-volatile semiconductor memory devices become increasingly integrated, a corresponding reduction in the size of a floating gate within each memory cell of the devices tends to reduce the capacitance between the control gate and floating gate of the memory cell. In order to improve the operating efficiency of the non-volatile semiconductor memory device at a low voltage, a coupling ratio of the dielectric layer must be increased. One way to increase the coupling ratio of the dielectric layer is to form a U-shaped floating gate. Another method is to form the floating gate with a thickness less than about 100 Å.

As an alternative method, a method of forming the floating gate using a nano-crystalline material rather than polysilicon has been studied.

In non-volatile semiconductor memory devices using the nano-crystalline material to form the floating gate, charges may be trapped in the nano-crystalline particles so that some inferior nano-crystalline particles do not have influence on storing the charge. Thus, the leakage current is reduced relative to non-volatile semiconductor memory device including the floating gate formed using polysilicon. One main material that has been studied as the nano-crystalline material is, for example, nano-crystalline silicon.

A nano-crystalline silicon layer is usually formed by chemical vapor deposition (CVD). Where the nano-crystalline silicon layer does not have nano-particles having proper size, uniform distribution and enough density, the charge stored in the nano-crystalline silicon layer is reduced. Hence, in the CVD process for forming the nano-crystalline silicon layer, it is very difficult to deposit silicon having proper size, uniform distribution and sufficient density.

As mentioned above, forming the thin gate conductive layer stably is important in the DRAM device having a fine design rule. Additionally, for forming the non-volatile semiconductor memory device having improved properties, it is important to form the polysilicon layer or the nano-crystalline silicon layer with relatively uniform thickness and roughness.

For that purpose, the surface of the silicon oxide layer is often treated with solution including hydrogen fluoride (HF) or solution including sulphuric acid ($H_2SO_4$) and hydrogen peroxide ($H_2O_2$). After the surface treatment, the CVD process is performed by introducing source gas having silicon, such as $SiH_4$, etc. By the surface treatment for the silicon oxide layer, silanol (SiOH) is formed on the surface of the silicon oxide layer. Then, silanol promotes a decomposition of silane so that a deposition rate of silane is increased.

However, when silanol is formed using the hydrogen fluoride solution, the silicon oxide layer is etched by the hydrogen fluoride solution so that the thickness of the silicon oxide layer is changed. In addition, when the silicon oxide layer is treated by the sulphuric acid solution and hydrogen peroxide solution, environment pollution occurs and the cost increases.

SUMMARY OF THE INVENTION

According to one embodiment of the invention, a method of manufacturing a gate structure comprises forming a silicon oxide layer on a substrate, treating the silicon oxide layer with a solution comprising ozone, and forming a conductive layer on the silicon oxide layer treated with the solution.

According to another embodiment of the invention, a method of manufacturing a gate structure comprises forming a gate oxide layer on a substrate, treating the gate oxide layer with a solution comprising ozone, forming a gate conductive layer on the gate oxide layer treated with the solution, forming a mask layer on the gate conductive layer, and forming a gate mask pattern, a gate conductive layer pattern, and a gate oxide layer pattern by patterning the mask layer, the gate conductive layer and the gate oxide layer.

According to still another embodiment of the invention, a method of manufacturing a gate structure comprises forming a tunnel oxide layer on a substrate treating the tunnel oxide layer with a solution comprising ozone, forming a floating gate layer on the tunnel oxide layer treated with the solution, forming a dielectric layer on the floating gate layer, forming a control gate layer on the dielectric layer, and forming a control gate, a dielectric layer pattern, a floating gate, and a tunnel oxide layer pattern by patterning the control gate layer, the dielectric layer, the floating gate layer and the tunnel oxide layer.

According to still another embodiment of the invention, a method of manufacturing a non-volatile memory device comprises forming a gate oxide layer on a substrate, treating the gate oxide layer with a solution comprising ozone, forming a gate conductive layer on the gate oxide layer treated with the solution, forming a mask layer on the gate conductive layer, forming a gate structure including a gate mask pattern, a gate conductive layer pattern, and a gate oxide layer pattern by patterning the mask layer, the gate conductive layer and the gate oxide layer, forming an insulating interlayer to cover the gate structure, forming a contact connected with the substrate through the insulating interlayer, and forming an upper wiring structure electrically connected with the contact.

According to yet another embodiment of the present invention, a method of manufacturing a non-volatile memory device comprises forming a tunnel oxide layer on a substrate, treating the tunnel oxide layer with a solution comprising ozone, forming a floating gate layer on the tunnel oxide layer treated with the solution, forming a dielectric layer on the floating gate layer, forming a control gate layer on the dielectric layer, forming a gate structure including a control gate, a dielectric layer pattern, a floating gate, and a tunnel oxide layer pattern by patterning the control gate layer, the dielectric layer, the floating gate layer and the tunnel oxide layer, forming an insulating interlayer to cover the gate structure, forming a contact connected with the substrate through the insulating interlayer, and forming an upper wiring structure electrically connected with the contact.

BRIEF DESCRIPTION OF THE DRAWINGS

The invention is described below in relation to several embodiments illustrated in the accompanying drawings. Throughout the drawings like reference numbers indicate like exemplary elements, components, or steps, and the thickness of layers is exaggerated for clarity. In the drawings.

DESCRIPTION OF EXAMPLE EMBODIMENTS

Example embodiments of the invention are described below with reference to the corresponding drawings. These embodiments are presented as teaching examples. The actual scope of the invention is defined by the claims that follow.

Figure 1A:
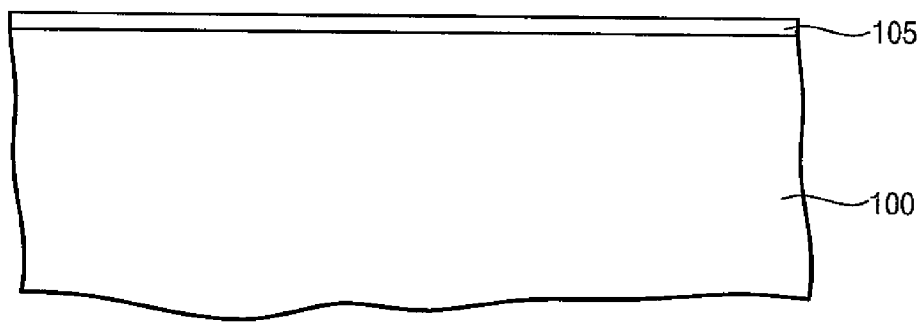
FIGS. 1A through 1C are cross-sectional views illustrating a method of manufacturing a gate structure in accordance with an example embodiment of the invention.
Figure 1B:
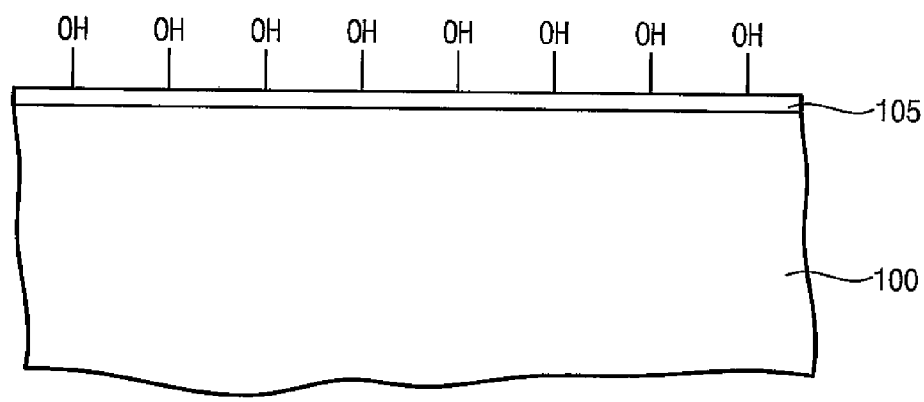
Figure 1C:
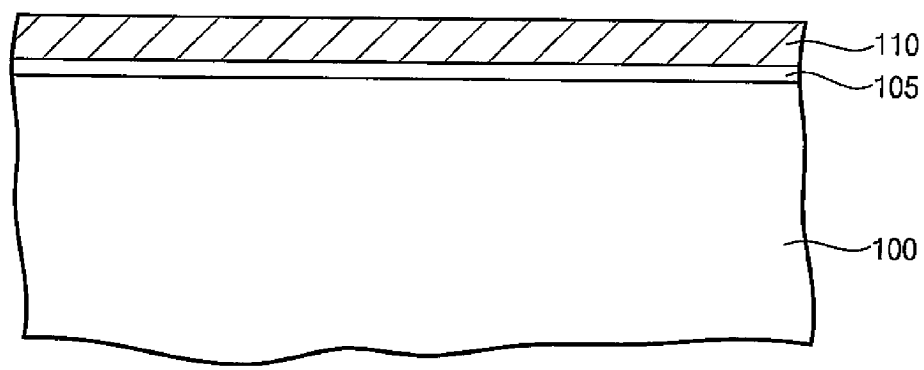

FIGS. 1A to 1C are cross-sectional views illustrating a method of manufacturing a gate structure in accordance with an example embodiment of the present invention.

Referring to FIG. 1A, an oxide layer 105 having a thin thickness is formed on a substrate 100. Substrate 100 may include a silicon wafer or a silicon on insulator (SOI) substrate. Oxide layer 105 may be formed using a silicon oxide. The thickness of oxide layer 105 can be varied according to a semiconductor device. Oxide layer 105 typically serves as a gate oxide layer in a volatile semiconductor memory device or a tunnel oxide layer in a non-volatile semiconductor memory device. Oxide layer 105 is typically formed by a thermal oxidation process or a chemical vapor deposition (CVD) process. In one embodiment of the invention, oxide layer 105 is formed by a thermal oxidation process that is performed in an atmosphere of oxygen ($O_2$) or water vapor ($H_2O$).

A surface of substrate 100 including oxide layer 105 is treated with a solution including ozone ($O_3$). In some embodiments of the invention, the solution additionally includes de-ionized (DI) water. A conductive layer 110 (See, FIG. 1C) comprising polysilicon or polysilicon germanium is formed on oxide layer 105 after treating the surface of substrate 100 with the solution. By performing the surface treatment, a deposition rate of conductive layer 110 can be increased and the uniformity and roughness of conductive layer 110 can be improved.

Preferably, the solution contains an ozone concentration of about 30 ppm to about 300 ppm. The solution including ozone may be introduced onto oxide layer 105 at a flow rate of about 2 L/min for about 60 seconds to about 600 seconds. For example, the solution including ozone having a concentration of about 30 ppm is commonly introduced onto oxide layer 105 for about 300 seconds. A preferred minimum effective concentration of ozone included in the solution is about 30 ppm. When oxide layer 105 is treated with the solution including ozone having a concentration higher than about 300 ppm, there is no substantial difference in improved degree of a flow rate or a roughness of conductive layer 110 according to an increase of an ozone concentration.

Referring to FIG. 1B, when oxide layer 105 is treated with the solution including ozone, a hydroxyl group (OH⁻) is formed on the surface of oxide layer 105. This mechanism is described in further detail below.

Ozone can be used to generate a hydroxyl radical (OH⁻) by the following example reactions:

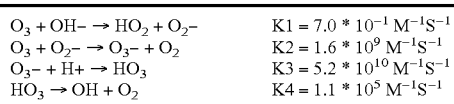

| | |
|---|---|
| $O_3 + OH^- \rightarrow HO_2 + O_2^-$ | $K1 = 7.0 * 10^{-1} M^{-1}S^{-1}$ |
| $O_3 + O_2^- \rightarrow O_3^- + O_2$ | $K2 = 1.6 * 10^{9} M^{-1}S^{-1}$ |
| $O_3^- + H^+ \rightarrow HO_3$ | $K3 = 5.2 * 10^{10} M^{-1}S^{-1}$ |
| $HO_3 \rightarrow OH + O_2$ | $K4 = 1.1 * 10^{5} M^{-1}S^{-1}$ |

When oxide layer 105 including a silicon oxide is treated with the solution including ozone, the hydroxyl group is formed on the surface of oxide layer 105 by a hydroxylation between the hydroxyl radical generated from ozone and oxide layer 105. Thus, silanol (SiOH) is formed on a portion of the surface of oxide layer 105.

A difference between an electronegativity of a hydrogen atom (2.1) and that of an oxygen atom (3.5) is very great in a silanol molecule. Since the electronegativity of the oxygen atom is larger than that of the hydrogen atom, the hydrogen atom has a positive partial charge and the oxygen atom has a negative partial charge. That is, the silanol molecule is polarized. However, in silane ($SiH_4$) used as a source gas in a formation of conductive layer 110 including silicon, the electronegativity of the hydrogen atom (2.1) is larger than that of a silicon atom (1.8). Hence, the silicon atom has a positive partial charge and the hydrogen atom has a negative partial charge by a difference of the electronegativity. When a silane molecule is absorbed on the surface of oxide layer 105, an interaction between the hydrogen atom having the positive partial charge of the silanol molecule and the hydrogen atom having the negative partial charge of the silane molecule may occur. The interaction tends to promote a separation of the hydrogen atom in the silane molecule. Thus, when conductive layer 110 including silicon is formed on oxide layer 105 including the hydroxyl group, a deposition rate of conductive layer 110 typically increases.

Referring to FIG. 1C, conductive layer 110 is formed on oxide layer 105 treated with the solution including ozone. Conductive layer 110 is typically formed using polysilicon or polysilicon germanium. These can be used alone or in a mixture. In some embodiments of the invention, conductive layer 110 is formed in a single-layered structure such as a polysilicon layer or a polysilicon germanium layer. In other embodiments, conductive layer 110 is formed in a multi-layered structure including a polysilicon layer and a polysilicon germanium layer. In still other embodiments, conductive layer 110 is formed in a polycide structure including a polysilicon layer or a polysilicon germanium layer and a metal silicide layer formed on the polysilicon layer or the polysilicon germanium layer. Conductive layer 110 typically serves as a gate electrode in a volatile semiconductor memory device or a floating gate in a non-volatile semiconductor memory device.

Conductive layer 110 may be formed by a chemical mechanical deposition (CVD) process, a low pressure-CVD (LP-CVD) process or an ultra high vacuum-CVD (UHV-CVD) process.

In one embodiment of the invention, conductive layer 110 includes polysilicon doped with impurities. Where conductive layer 110 is formed using polysilicon doped with impurities, a gas including silicon is used as a source gas. The gas including silicon typically includes silane ($SiH_4$), disilane ($Si_2H_6$), or dichlorosilane ($SiCl_2H_2$). In an example embodiment of the present invention, after forming a polysilicon layer on oxide layer 105 using silane, impurities are implanted by a thermal diffusion process or an ion implantation process to form conductive layer 110. In another embodiment of the invention, silane as the source gas and impurities are simultaneously introduced to form conductive layer 110.

In another example embodiment of the invention, conductive layer 110 includes polysilicon germanium doped with impurities. Where conductive layer 110 is formed using polysilicon germanium doped with impurities, a gas including silicon and a gas including germanium are together used as source gases. The source gas including silicon often comprises silane ($SiH_4$) and the source gas including germanium often comprises germane ($GeH_4$).

Properties of a polysilicon layer formed on an oxide layer treated with ozone will be further described in relation to the following Examples 1-3 and corresponding Comparative Examples 1-3 below.

EXAMPLE 1

A silicon oxide layer having a thickness of about 1,000 Å was formed. A surface of the silicon oxide layer was treated with de-ionized water including ozone having a concentration of about 30 ppm at a flow rate of about 20 L/min for about 300 seconds. After treating for the silicon oxide layer, $SiH_4$ and $PH_3$ as a source gas were introduced onto the silicon oxide layer at a flow rate of about 400 sccm for about 10 minutes. That is, a polysilicon layer was formed on the silicon oxide layer by a CVD process. An average thickness of the polysilicon layer was about 66 Å.

COMPARATIVE EXAMPLE 1

A silicon oxide layer having a thickness of about 1,000 Å was formed. A surface treatment for the silicon oxide layer was not performed. $SiH_4$ and $PH_3$ as a source gas were introduced onto the silicon oxide layer at a flow rate of about 400 sccm for about 10 minutes. That is, a polysilicon layer was formed on the silicon oxide layer by a CVD process. An average thickness of the polysilicon layer was about 30 Å.

EXAMPLE 2

A silicon oxide layer having a thickness of about 1,000 Å was formed. A surface of the silicon oxide layer was treated with a de-ionized water including ozone having a concentration of about 30 ppm at a flow rate of about 20 L/min for about 300 seconds. After treating of the silicon oxide layer, $SiH_4$ and $PH_3$ as a source gas were introduced onto the silicon oxide layer at a flow rate of about 400 sccm for about 15 minutes. That is, a polysilicon layer was formed on the silicon oxide layer by a CVD process. An average thickness of the polysilicon layer was about 113 Å.

COMPARATIVE EXAMPLE 2

A silicon oxide layer having a thickness of about 1,000 Å was formed. A surface treatment of the silicon oxide layer was not performed. $SiH_4$ and $PH_3$ as a source gas were introduced onto the silicon oxide layer at a flow rate of about 400 sccm for about 15 minutes. That is, a polysilicon layer was formed on the silicon oxide layer by a CVD process. An average thickness of the polysilicon layer was about 111 Å.

EXAMPLE 3

A silicon oxide layer having a thickness of about 1,000 Å was formed. A surface of the silicon oxide layer was treated with a de-ionized water including ozone having a concentration of about 30 ppm at a flow rate of about 20 L/min for about 300 seconds. After treating of the silicon oxide layer, SiH$_4$ and PH$_3$ as a source gas were introduced onto the silicon oxide layer at a flow rate of about 400 sccm for about 20 minutes. That is, a polysilicon layer was formed on the silicon oxide layer by a CVD process. An average thickness of the polysilicon layer was about 165 Å.

COMPARATIVE EXAMPLE 3

A silicon oxide layer having a thickness of about 1,000 Å was formed. A surface treatment of the silicon oxide layer was not performed. SiH$_4$ and PH$_3$ as a source gas were introduced onto the silicon oxide layer at a flow rate of about 400 sccm for about 20 minutes. That is, a polysilicon layer was formed on the silicon oxide layer by a CVD process. An average thickness of the polysilicon layer was about 161 Å.

Measured thicknesses of polysilicon layers and root mean square (RMS) values of roughness of the polysilicon layers according to Examples 1-3 and Comparative Examples 1-3 are shown in Table 1 below.

TABLE 1

| | Example 1 | Comparative Example 1 | Example 2 | Comparative Example 2 | Example 3 | Comparative Example 3 |
|---|---|---|---|---|---|---|
| Average thickness (Å) | 65.50 | 30.28 | 112.99 | 111.25 | 165.47 | 160.89 |
| RMS (nm) | 0.536 | 0.793 | 0.513 | 0.765 | 0.535 | 0.790 |

Figure 2:
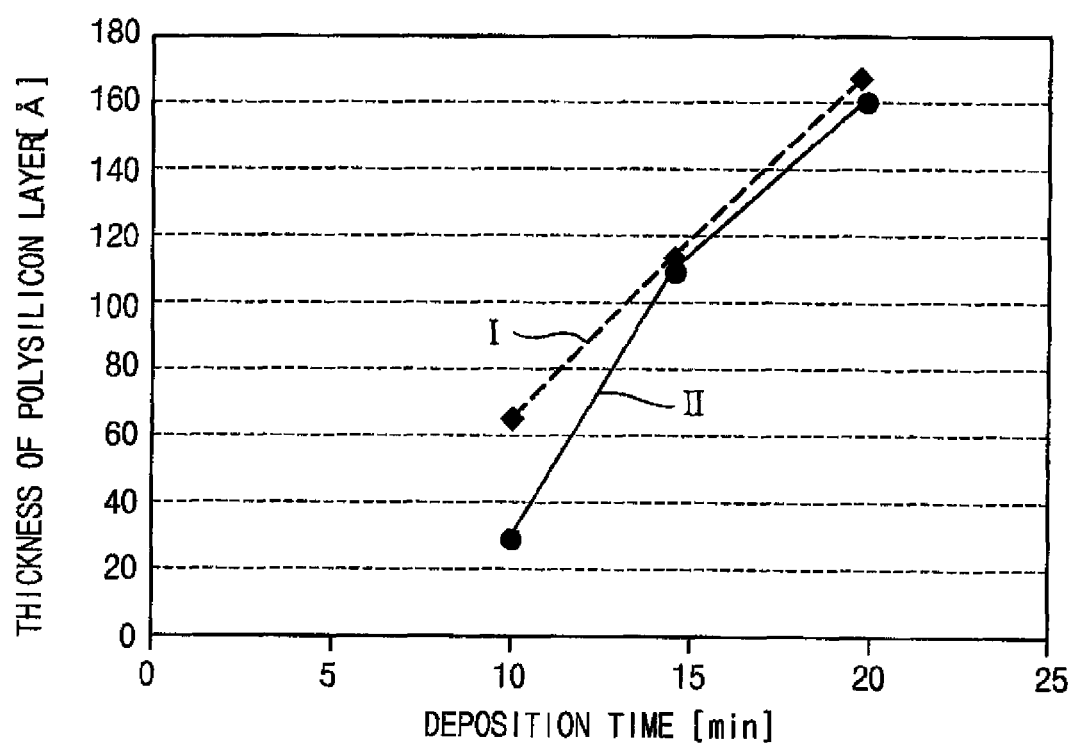
FIG. 2 is a graph illustrating a thickness of a polysilicon layer formed on a silicon oxide layer after a surface treatment with a solution including ozone is performed on the silicon oxide layer in accordance with an example embodiment of the present invention.

FIG. 2 is a graph illustrating thicknesses of polysilicon layers formed on a silicon oxide layer after a surface treatment with a solution including ozone is performed on the silicon oxide layer in accordance with an example embodiment of the present invention, and thicknesses of polysilicon layer formed on a silicon oxide layer without the surface treatment.

In the surface treatment, the silicon oxide layer having a thickness of about 1,000 Å was treated with a de-ionized water including ozone having a concentration of about 30 ppm at a flow rate of about 20 L/min for about 300 seconds. In FIG. 2, a line labeled "I" illustrates thicknesses of polysilicon layers formed by introducing a source gas including SiH$_4$ and PH$_3$ at a flow rate of about 400 sccm for about 10 minutes, about 15 minutes and about 20 minutes, after the surface treatment. A line labeled "II" illustrates thicknesses of the polysilicon layers formed by introducing a source gas including SiH$_4$ and PH$_3$ at a flow rate of about 400 sccm for about 10 minutes, about 15 minutes and about 20 minutes, without the surface treatment.

Referring to Table 1 and FIG. 2, an average thickness of a polysilicon layer formed for about 10 minutes after the surface treatment is about 66 Å. An average thickness of a polysilicon layer formed for about 10 minutes without the surface treatment is about 30 Å. Thus, when the polysilicon layer is formed after the surface treatment, a deposition rate of the polysilicon layer is as about twice as a deposition rate without the surface treatment. However, an average thickness of a polysilicon layer formed for about 15 minutes after the surface treatment is about 113 Å and without the surface treatment is about 111 Å. In addition, an average thickness of a polysilicon layer formed for about 20 minutes after the surface treatment is about 165 Å and without the surface treatment is about 161 Å. Therefore, deposition rate improvement of the polysilicon layer according to the surface treatment for the silicon oxide layer may have an effect on the polysilicon layer within about 10 minutes.

When conductive layer 110 is formed using polysilicon on oxide layer 105 after the surface treatment for oxide layer 105, conductive layer 110 may be formed with a high initial rate. Hence, when conductive layer 110 having a thin thickness of less than about 100 Å is required, conductive layer 110 may be formed with a high rate after performing the surface treatment.

Figure 3:
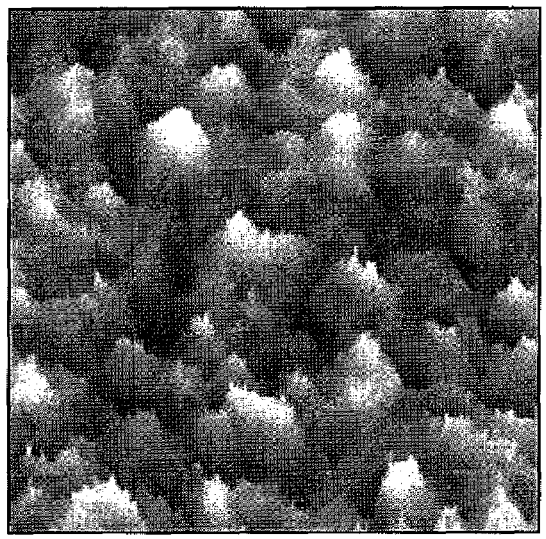
FIG. 3 is an atomic force microscope (AFM) picture showing a surface of a polysilicon layer formed without performing a surface treatment on an underlying silicon oxide layer.
Figure 4:
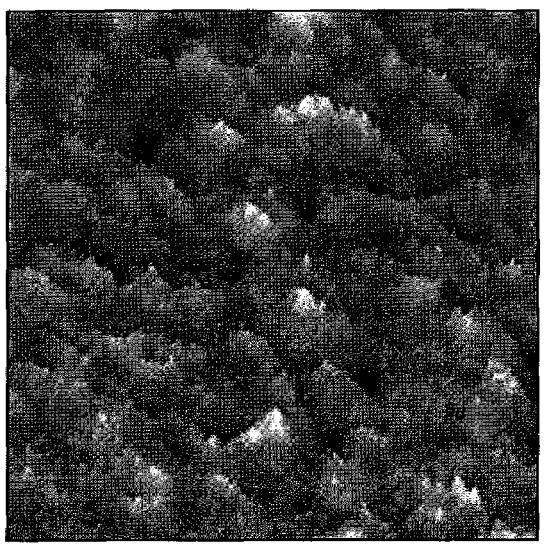
FIG. 4 is an AFM picture showing a surface of a polysilicon layer formed after a surface treatment is performed on an underlying silicon oxide layer in accordance with an example embodiment of the present invention.

FIG. 3 is an atomic force microscope picture showing a surface of a polysilicon layer formed without a surface treatment for a silicon oxide layer. FIG. 4 is an AFM picture showing a surface of a polysilicon layer formed after a surface treatment for a silicon oxide layer in accordance with an example embodiment of the present invention.

Referring to Table 1 and FIGS. 3 and 4, a root mean square (RMS) value of the measured thickness of a polysilicon layer formed on the silicon oxide layer without performing the surface treatment is in a range of about 0.76 nm to about 0.79 nm. However, a RMS value of the measured thickness of a polysilicon layer formed after performing the surface treatment is in a range of about 0.51 nm to about 0.53 nm. Accordingly, the polysilicon layer formed after the surface treatment has an improved roughness relative to the polysilicon layer formed without the surface treatment.

FIGS. 5A through 5D are cross-sectional views illustrating a method of manufacturing a gate structure in accordance with an example embodiment of the present invention.

Figure 5A:
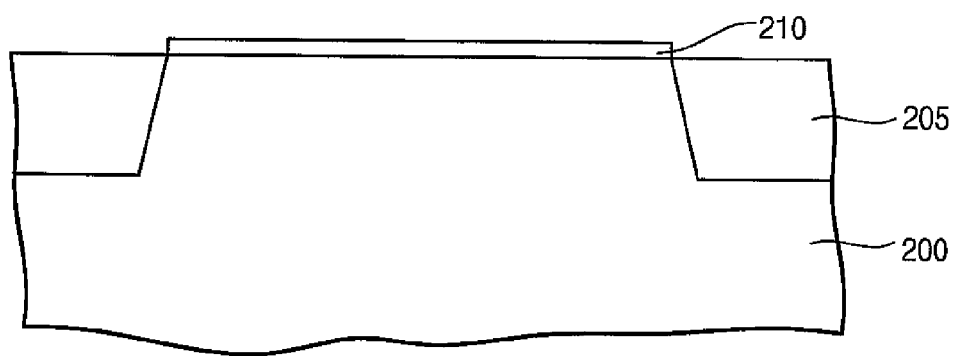
FIGS. 5A through 5D are cross-sectional views illustrating a method of manufacturing a gate structure in accordance with an example embodiment of the present invention.

Referring to FIG. 5A, an isolation layer 205 is formed on a substrate 200 by an isolation process such as a shallow trench isolation (STI) process or a local oxidation of silicon (LOCOS) process to define an active region and a field region. Substrate 200 may include a silicon wafer or a SOI substrate.

A gate oxide layer 210 having a thin thickness is formed on the active region of substrate 200. Gate oxide layer 210 is typically formed using silicon oxide. The thickness of gate oxide layer 210 tends to vary according to a design rule of a semiconductor device. For example, in a semiconductor device having a fine design rule, gate oxide layer 210 may be formed with a thickness of less than 40 Å. Gate oxide layer 210 is typically formed by a thermal oxidation process or a CVD process.

A surface treatment using a solution including ozone is performed for substrate 200 including gate oxide layer 210 thereon. In some embodiments of the invention, the solution including ozone also includes de-ionized (DI) water. As a result of the surface treatment performed on gate oxide layer 210, when a gate conductive layer 215 (See, FIG. 5B) is formed using polysilicon or polysilicon germanium, a deposition rate of gate conductive layer 215 tends to increase. In addition, uniformity and roughness of gate conductive layer 215 tends to improve.

In an example embodiment of the present invention, the surface of gate oxide layer 210 may be treated with the solution including ozone having a concentration of about 30 ppm to about 300 ppm. The solution including ozone may be introduced onto gate oxide layer 210 at a flow rate of about 2 L/min for about 60 seconds to about 600 seconds. A minimum effective concentration of ozone included in the solution may be about 30 ppm. When gate oxide layer 210 is treated with the solution including ozone having a concentration of more than about 300 ppm, there is no substantial difference in improved degree of a flow rate or a roughness of gate conductive layer 215 according to an increase of an ozone concentration.

When gate oxide layer 210 including a silicon oxide is treated with the solution including ozone, the hydroxyl group is formed on the surface of gate oxide layer 210 by a hydroxylation between the hydroxyl radical generated from ozone and gate oxide layer 210. When a silane ($SiH_4$) molecule is absorbed on the surface of gate oxide layer 210, an interaction between a hydrogen atom having the positive partial charge of the hydroxyl group and a hydrogen atom having the negative partial charge of the silane molecule occurs. The interaction promotes a separation of the hydrogen atom in the silane molecule. Thus, a silicon atom may be deposited for gate oxide layer 210 at a high rate. That is, a deposition rate of polysilicon increases. In addition, uniformity and roughness of a gate conductive layer formed thereon improves.

Figure 5B:
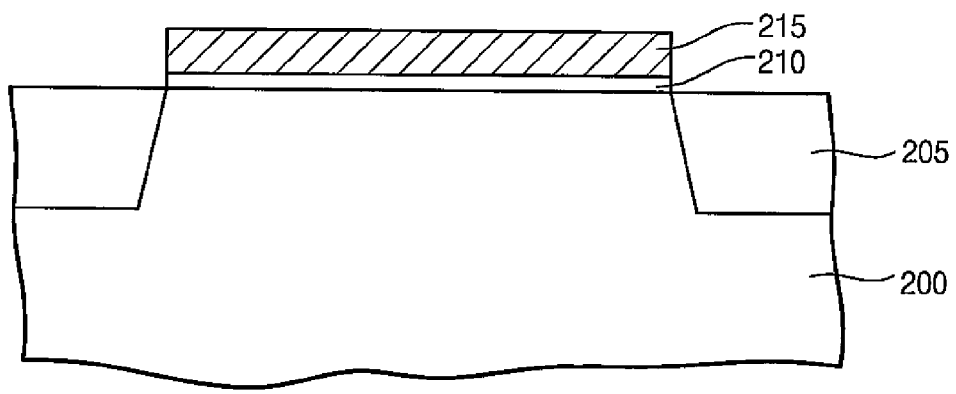

Referring to FIG. 5B, a gate conductive layer 215 is formed on gate oxide layer 210. Gate conductive layer 215 may be formed using polysilicon or polysilicon germanium. In one embodiment of the present invention, gate conductive layer 215 is formed in a single-layered structure such as a polysilicon layer or a polysilicon germanium layer. In other embodiments of the invention, gate conductive layer 215 is formed in a polycide structure that includes a polysilicon layer or a polysilicon germanium layer and a metal silicide layer formed on the polysilicon layer or the polysilicon germanium layer. Gate conductive layer 215 is patterned to form a gate conductive layer pattern.

Gate conductive layer 215 may be formed by a CVD process, an LP-CVD process or an UHC-CVD process.

In one embodiment of the present invention, gate conductive layer 215 includes polysilicon doped with impurities. Where gate conductive layer 215 is formed using polysilicon doped with impurities, a gas including silicon is generally used as a source gas. The source gas including silicon typically includes silane ($SiH_4$), disilane ($Si_2H_8$), or dichlorosilane ($SiCl_2H_2$). In some embodiments of the invention, after forming a polysilicon layer on gate oxide layer 210 using silane, impurities are implanted by a thermal diffusion process or an ion implantation process to form gate conductive layer 215. In another example embodiment of the invention, silane as the source gas and the impurities are simultaneously introduced to form gate conductive layer 215.

Figure 5C:
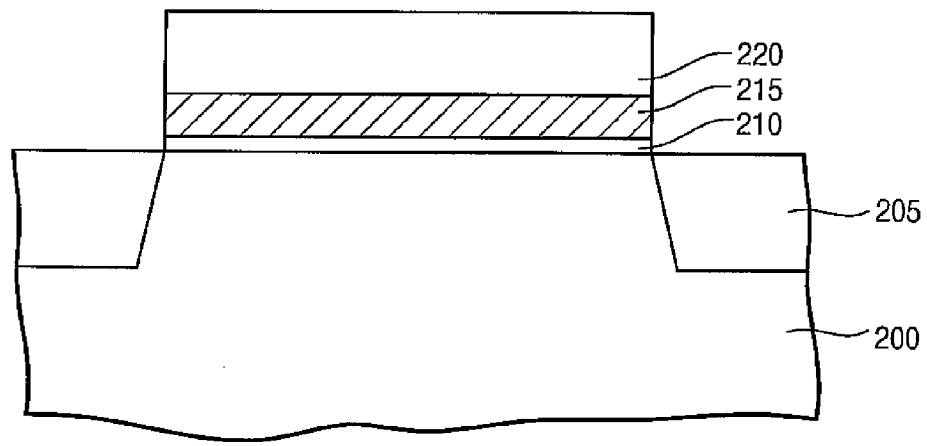

Referring to FIG. 5C, a mask layer 220 is formed on gate conductive layer 215. Mask layer 220 may be patterned to a gate mask pattern. Mask layer 220 may be formed using a nitride such as silicon nitride.

Figure 5D:
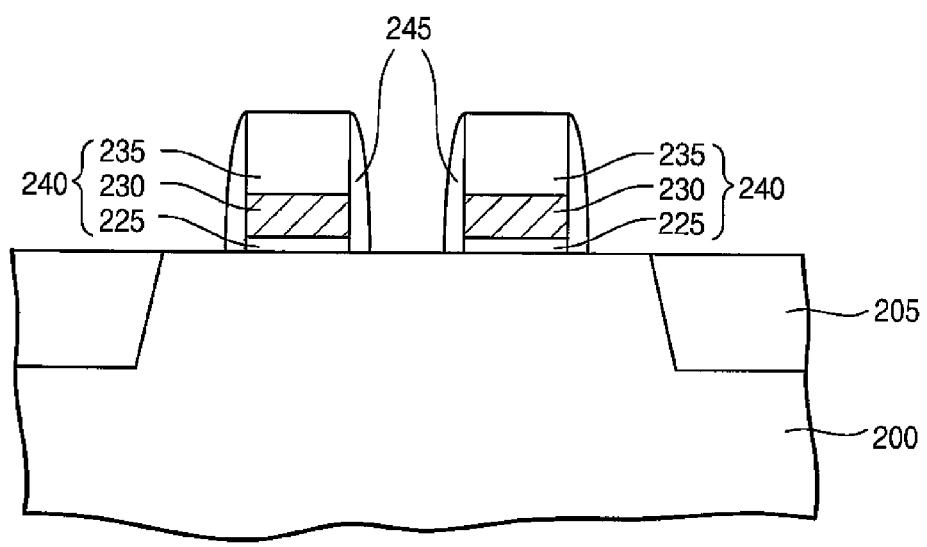

Referring to FIG. 5D, a photoresist film (not shown) is formed on mask layer 220. The photoresist film is exposed to light and developed to form a photoresist pattern on mask layer 220. Mask layer 220, gate conductive layer 215, and gate oxide layer 210 are successively patterned using the photoresist film as an etching mask. Thus, a gate structure 240 including a gate oxide layer pattern 225, a gate conductive layer pattern 230 and a gate mask pattern 235, is formed on substrate 200. That is, mask layer 220, gate conductive layer 215, and gate oxide layer 210 are successively patterned to form gate structure 240 on the substrate.

In another embodiment of the invention, mask layer 220 is patterned using the photoresist pattern as an etching mask, so that gate mask pattern 235 is first formed on gate conductive layer 215. The photoresist pattern on gate mask pattern 235 is removed by an ashing process and/or a stripping process. Then, gate conductive layer 215 and gate oxide layer 210 are successively patterned using gate mask pattern 235 as an etching mask. Hence, gate structure 240 including gate oxide layer pattern 225, gate conductive layer pattern 230 and gate mask pattern 235 is formed on substrate 200.

A spacer 245 may be further formed on a sidewall of gate structure 240. In another example embodiment of the present invention, spacer 245 is not formed on a sidewall of gate structure 240.

FIGS. 6A through 6D are cross-sectional views illustrating a method of manufacturing a gate structure in a non-volatile semiconductor memory device in accordance with an example embodiment of the present invention.

Figure 6A:
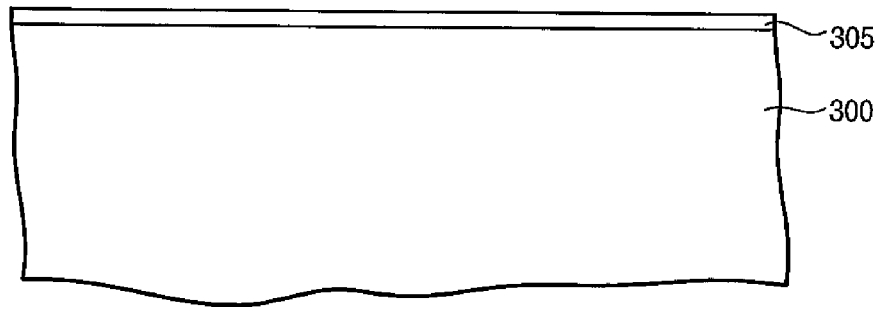
FIGS. 6A through 6D are cross-sectional views illustrating a method of manufacturing a gate structure in a non-volatile semiconductor memory device in accordance with an example embodiment of the present invention.

Referring to FIG. 6A, an active region and a field region are defined on a substrate 300 by an isolation process such as a STI process or a LOCOS process. Substrate 300 may comprise a silicon wafer or a SOI substrate. A tunnel oxide layer 305 is formed on the active region of substrate 300. Tunnel oxide layer 305 serves as a tunnel gate. Tunnel oxide layer 305 may be formed by a thermal oxidation process or a CVD process. In an example embodiment of the present invention, tunnel oxide layer 305 is formed by a thermal oxidation process in an atmosphere containing oxygen or water vapor.

A surface treatment using a solution including ozone is performed for substrate 300 including tunnel oxide layer 305 thereon. In some embodiments of the invention, the surface of tunnel oxide layer 305 is treated with the solution including ozone having a concentration of about 30 ppm to about 300 ppm. Then, the solution including ozone is introduced onto tunnel oxide layer 305 at a flow rate of about 2 L/min for about 60 seconds to about 600 seconds. A minimum effective concentration of ozone included in the solution is about 30 ppm. Where a floating gate is formed on tunnel oxide layer 305 using a nano-crystalline material, a formation of the floating gate is promoted by the surface treatment.

Ozone generates a hydroxyl radical (OH) in water. Where tunnel oxide layer 305 including silicon is treated with the solution including ozone, a portion of the surface of tunnel oxide layer 305 is transformed to silanol (SiOH) by a hydroxylation between the hydroxyl radical generated from ozone and tunnel oxide layer 305. Where a hydroxyl group (—OH) is formed on tunnel oxide layer 305, a separation of a hydrogen atom from a source gas such as silane ($SiH_4$) may be promoted in the formation of the floating gate. That is, silicon may be deposited on tunnel oxide layer 305 at a high rate. As a result, the floating gate having nano-crystalline particles of desired density may be formed more rapidly than without the surface treatment.

Figure 7:
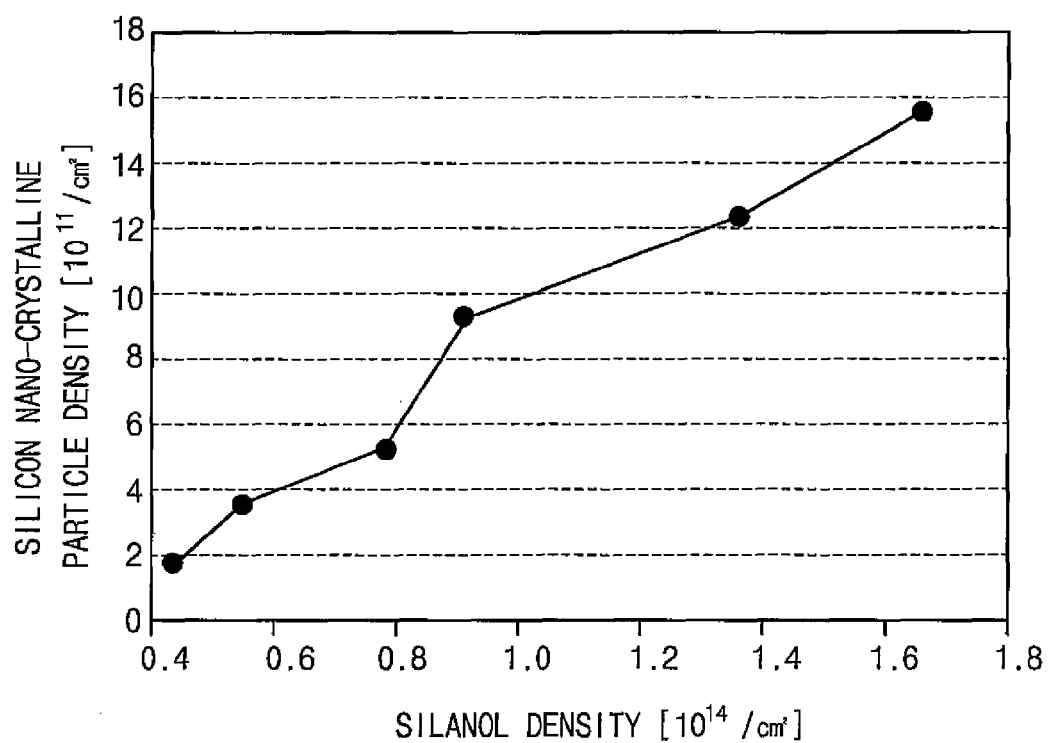
FIG. 7 is a graph illustrating a relationship between a density of silanol and a density of nano-crystalline silicon particles formed on a tunnel oxide layer shown in FIG. 6.

FIG. 7 is a graph illustrating a relationship between a density of silanol on a surface of tunnel oxide layer 305 and a density of nano-crystalline silicon particles formed on tunnel oxide layer 305.

Referring to FIG. 7, as the density of silanol on a surface of tunnel oxide layer 305 increases, the density of nano-crystalline silicon particles formed on tunnel oxide layer 305 also increases. In the floating gate including the nano-crystalline particles, the density of nano-crystalline particles for stable operation is about $10^{12}/cm^2$. Thus, as to form nano-crystalline particles having the density of about $10^{12}/cm^2$, forming silanol on the surface of tunnel oxide layer 205 may be effective.

Figure 6B:
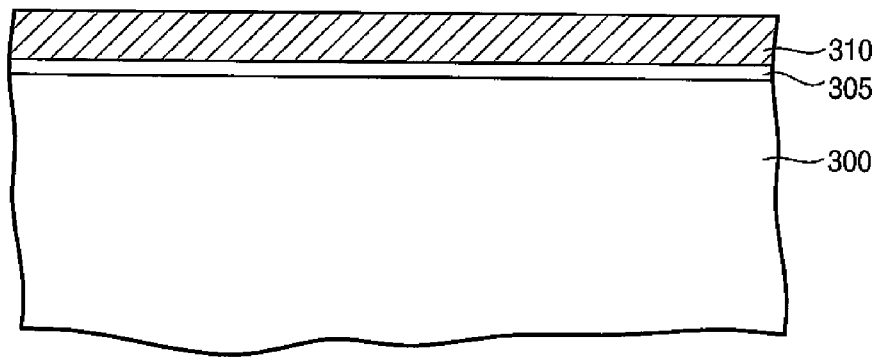

Referring to FIG. 6B, a floating gate layer 310 is formed on tunnel oxide layer 305 treated with the solution including ozone. Floating gate layer 310 is typically formed including nano-crystalline particles. In one embodiment of the invention, floating gate layer 310 is formed by an UHV-CVD process. In another embodiment of the invention, floating gate layer 310 is formed by an LP-CVD process. In order to form the nano-crystalline particles by the UHV-CVD process or the LP-CVD process, a source gas is introduced for a short time, for example, for about 10 seconds to 30 seconds. Then, an atom separated from the source gas is absorbed on a surface of tunnel oxide layer 305, forming a cluster having a diameter of about several nanometers to about several tens nanometers. A time required for crystallization and growth of the cluster is typically very short. Thus, to form the nano-crystalline particles having a required density, an incubation time of silicon nucleation may be reduced. Where the hydroxyl group is formed on the surface of tunnel oxide layer 305 by the surface treatment, silicon nucleation may be promoted. Therefore, floating gate layer 310 including the nano-crystalline particles having the required density may be stably formed by the surface treatment for tunnel oxide layer 305.

Floating gate layer 310 formed according to selected embodiments of the invention includes the nano-crystalline particles. The nano-crystalline particles may have a dot or a cluster shape capable of trapping an electron. A size capable of trapping an electron is about several nanometers to about several tens nanometers, for example about 30 nm. Additionally, a density capable of trapping the electron is about $10^{12}/cm^2$. The nano-crystalline particles often include nano-crystalline silicon or nano-crystalline silicon germanium. In selected embodiments of the invention, floating gate layer 310 includes the nano-crystalline silicon. Then a source gas including silicon, such as silane ($SiH_4$), disilane ($Si_2H_6$), dichlorosilane ($SiCl_2H_2$) may be used for forming floating gate layer 310. In other embodiments of the invention, floating gate layer 310 includes the nano-crystalline silicon germanium. Then a source gas including silicon germanium, such as silane and germane ($GeH_4$) are used to form floating gate layer 310.

Figure 6C:
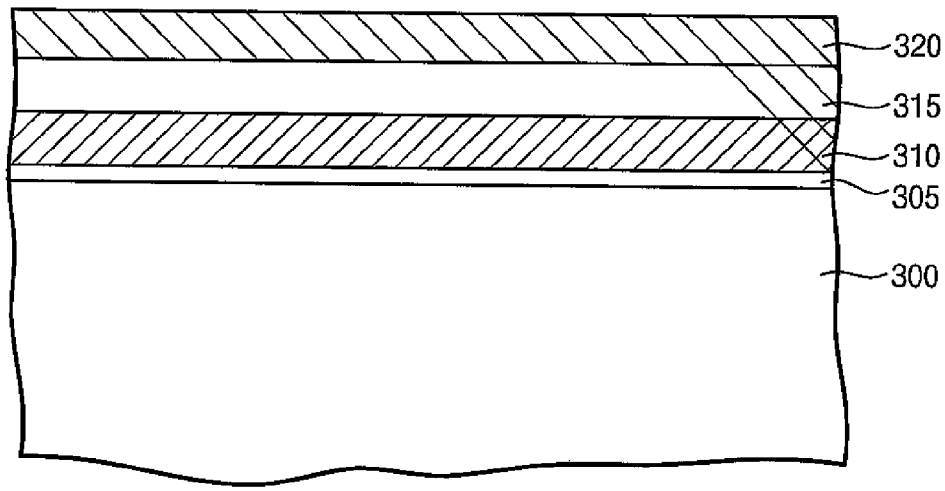

Referring to FIG. 6C, a dielectric layer 315 is formed on floating gate layer 310. Dielectric layer 315 may be formed by an atomic layer deposition (ALD) process using a high-k material. In selected embodiments of the invention, dielectric layer 315 has a structure comprising the following successively formed layers: an oxide layer, a nitride layer and an oxide layer. In other embodiments, dielectric layer 315 is formed using a high-k material. In such cases, dielectric layer 315 typically has a thin equivalent oxide thickness (EOT) and a leakage current through dielectric layer 315 is reduced. For example, dielectric layer 315 is formed using hafnium oxide, zirconium oxide, tantalum oxide, aluminum oxide, titanium oxide, rubidium oxide, magnesium oxide, strontium oxide, boron oxide, lead oxide, or calcium oxide. In addition, dielectric layer 315 is formed in a multi-layered structure comprising an oxide layer, a nitride layer and a high-k material layer, successively formed.

A control gate layer 320 is formed on dielectric layer 315. Control gate layer 320 is typically formed using polysilicon or a metal. Alternatively, control gate layer 320 is often formed in a polycide structure including a polysilicon layer and a metal silicide layer. In addition, control gate layer 320 can also be formed by a CVD process, an ALD process, or a sputtering process.

Figure 6D:
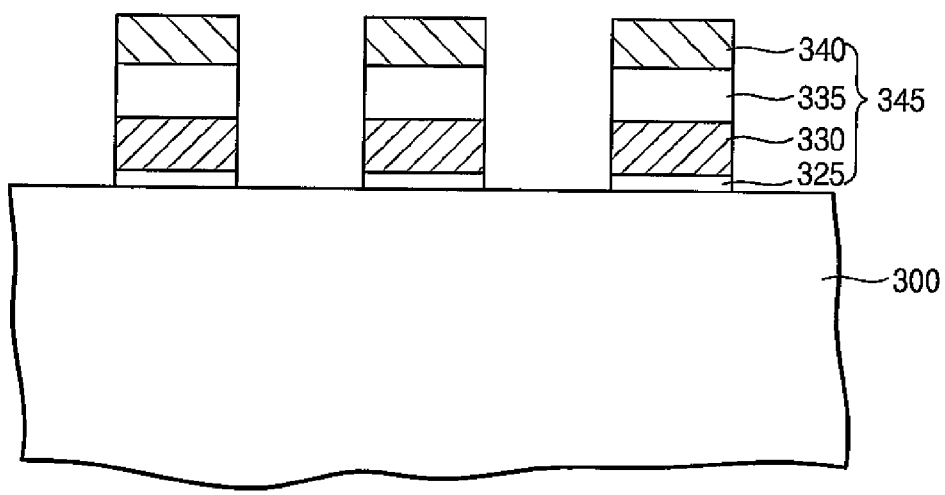

Referring to FIG. 6D, a hard mask (not shown) is formed on control gate layer 320. Control gate layer 320, dielectric layer 315, floating gate layer 310 and tunnel oxide layer 305 are successively patterned using the hard mask as an etching mask to form a gate structure 345. Gate structure 345 comprises a tunnel oxide layer pattern 325, a floating gate 330, a dielectric layer pattern 335 and a control gate 340. Gate structure 345 stores data by trapping a charge in an interface between the nano-crystalline particles included in floating gate 330.

FIGS. 8A through 8G illustrate a method of manufacturing a non-volatile semiconductor memory device including a U-shaped floating gate in accordance with an example embodiment of the present invention.

Figure 8A:
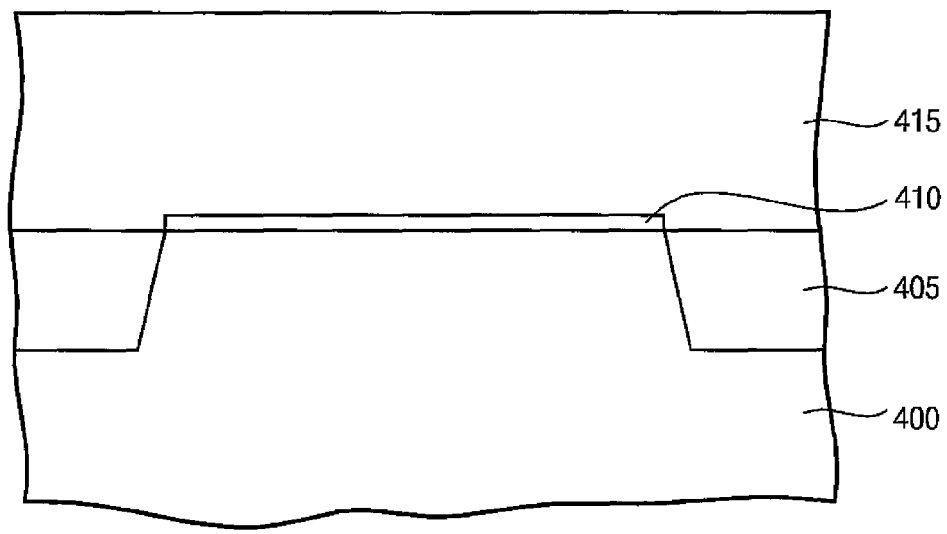
FIGS. 8A through 8G are cross-sectional views illustrating a method of manufacturing a non-volatile semiconductor memory device including a U-shaped floating gate in accordance with an example embodiment of the present invention.

Referring to FIG. 8A, an isolation layer 405 is formed on a substrate 400 by an isolation process such as a STI process. Substrate 400 typically includes a silicon wafer or a SOI substrate.

A tunnel oxide layer 410 is formed on substrate 400 over isolation layer 405. In some embodiments of the invention, tunnel oxide layer 410 is formed by a thermal oxidation process.

An etch stop layer 415 is formed on tunnel oxide layer 410. Etch stop layer 415 may be formed using an insulating material having an etching selectivity relative to tunnel oxide layer 410. For example, etch stop layer 415 is commonly formed using a nitride such as silicon nitride.

Figure 8B:
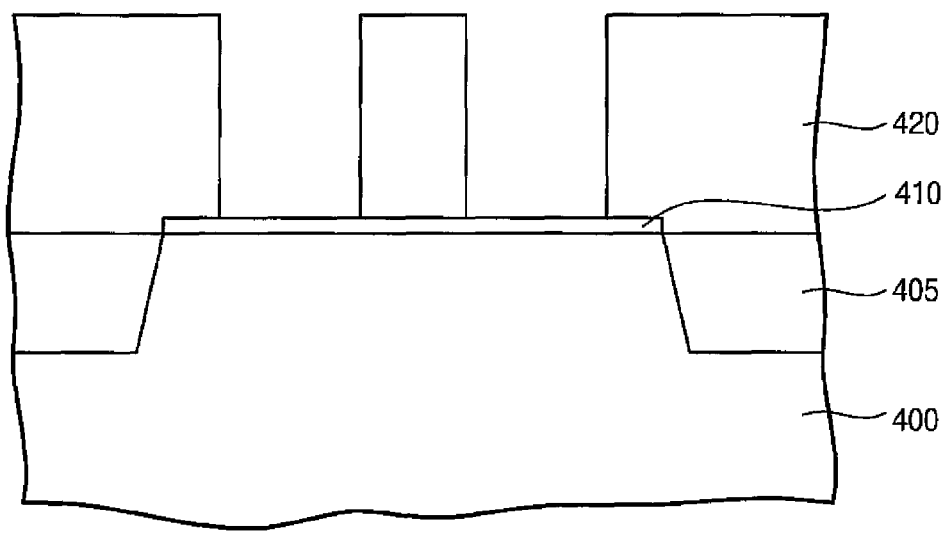

Referring to FIG. 8B, a first photoresist pattern (not shown) is formed on etch stop layer 415 is formed. The first photoresist pattern is formed by a lithography process after coating a photoresist composition on etch stop layer 415. Etch stop layer 415 is patterned using the first photoresist pattern as an etching mask to form an etch stop layer pattern 420. Thus, etch stop layer pattern 420 exposes a portion of tunnel oxide layer 410.

Substrate 400 including tunnel oxide layer 410 exposed through etch stop layer pattern 420 is treated with a solution including ozone in a wet bath. In some embodiments of the invention, the solution further includes de-ionized water. By a surface treatment using the solution including ozone, when a floating gate layer is formed on tunnel oxide layer 410 using polysilicon or polysilicon germanium, a deposition rate of the floating gate layer may be increased. In addition, uniformity and roughness of the floating gate layer may be improved.

A non-volatile semiconductor memory device according to an example embodiment of the present invention includes a floating gate having a U-shaped section. When the floating gate is formed having the U-shaped section, a surface area of the floating gate increases so that a capacity between the floating gate and a control gate also increases. In order to form the floating gate having the U-shaped section, the floating gate layer is formed with a thickness of about 100 Å. Where the floating gate layer is formed after treating tunnel oxide layer 410 with the solution including ozone, the floating gate layer is formed to have a thin and uniform thickness.

In selected embodiments of the present invention, the surface of tunnel oxide layer 410 is treated with the solution including ozone having a concentration of about 30 ppm to about 300 ppm. Then, the solution including ozone is introduced onto tunnel oxide layer 410 at a flow rate of about 2 L/min for about 60 seconds to about 600 seconds. A minimum effective concentration of ozone to be included in the solution is about 30 ppm.

Figure 8C:
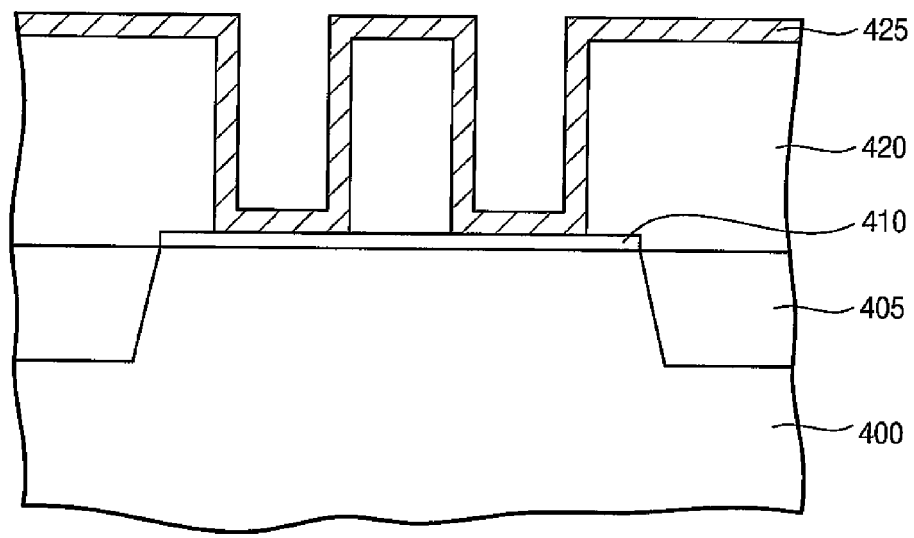

Referring to FIG. 8C, after the surface treatment for tunnel oxide layer 410, a conductive layer 425 is conformally formed on etch stop layer pattern 420. Conductive layer 425 may be formed using polysilicon. Conductive layer 425 is typically formed by a CVD process, an LP-CVD process, or an UHV-CVD process.

In an example embodiment of the present invention, conductive layer 425 is formed using polysilicon doped with impurities. Where gate conductive layer 425 is formed using polysilicon doped with impurities, a gas including silicon, such as silane ($SiH_4$), disilane ($Si_2H_8$) and dichlorosilane ($SiCl_2H_2$) is used as a source gas. For example, conductive layer 425 is formed by doping impurities by a thermal diffusion process or an ion implantation process, after a polysilicon layer is formed using silane. In another embodiment of the invention, conductive layer 425 is formed by simultaneously introducing the source gas and the impurities.

Figure 8D:
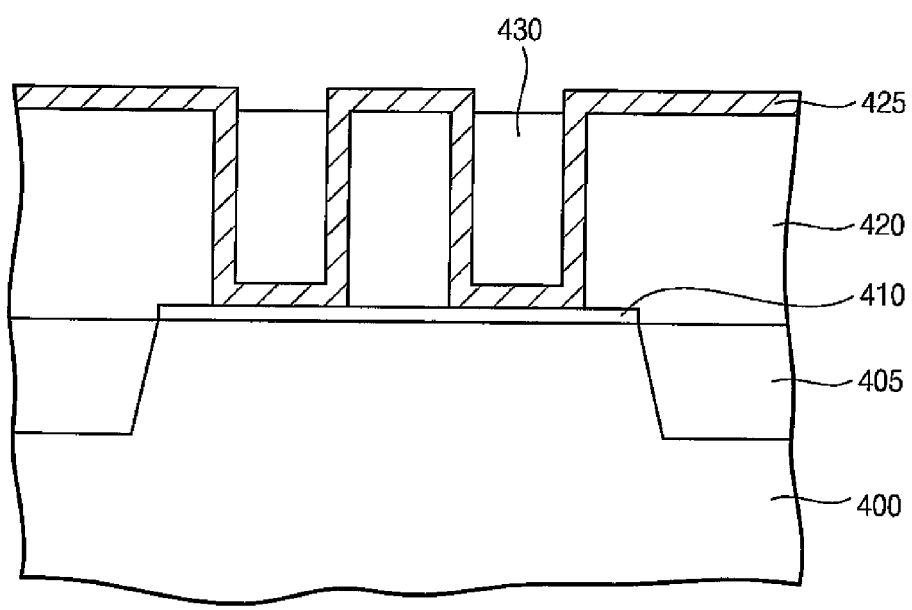

Referring to FIG. 8D, a photoresist film is formed on conductive layer 425. The photoresist film is partially removed until conductive layer 425 on etch stop layer pattern 420 is exposed. Hence, the photoresist film remains in an opening surrounded by conductive layer 425 to form a second photoresist pattern 430.

Figure 8E:
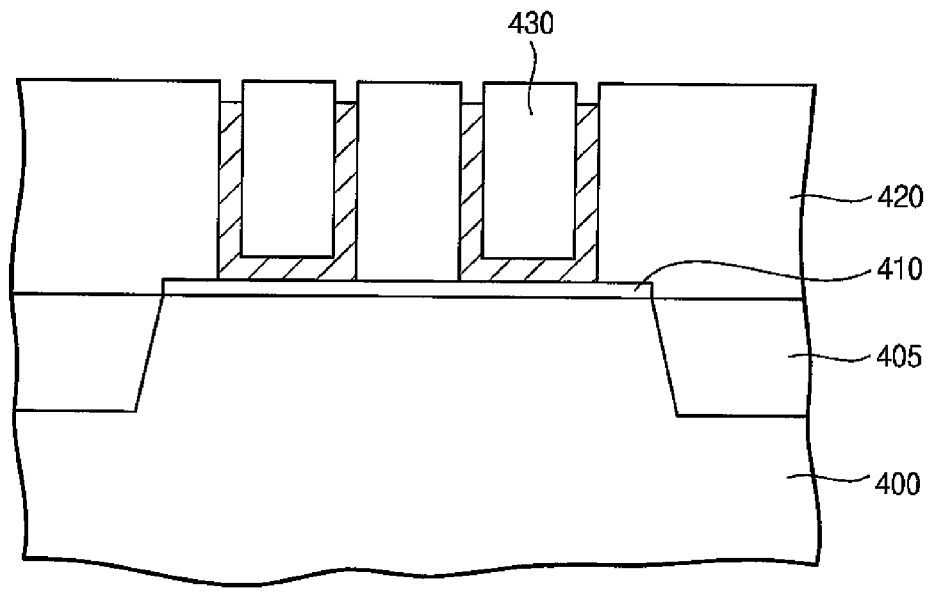

Referring to FIG. 8E, conductive layer 425 on etch stop layer 425 is partially removed using the second photoresist pattern 430 as an etching mask until etch stop layer pattern 420 is exposed.

Figure 8F:
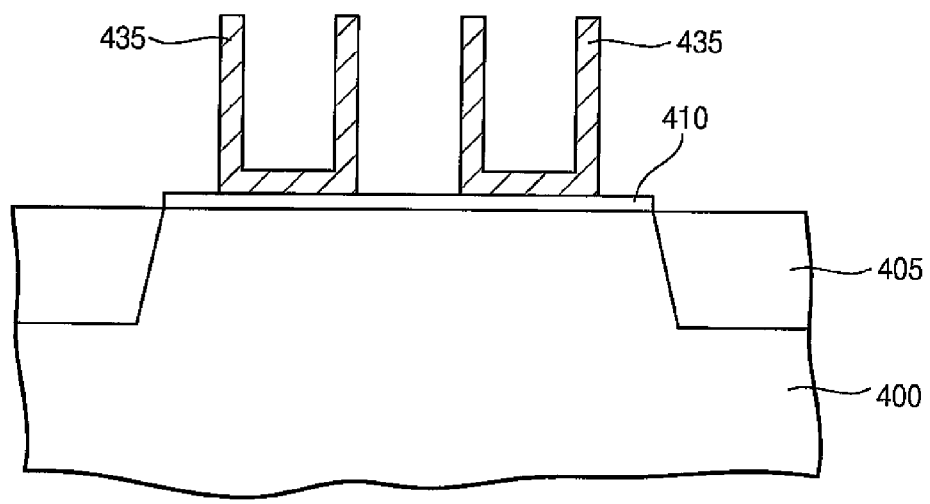

Referring to FIG. 8F, second photoresist pattern 430 is removed to expose an interior sidewall of a floating gate 435. Etch stop layer pattern 420 is removed to expose an exterior sidewall of floating gate 435. In addition, an exposed tunnel oxide layer 410 is partially removed using floating gate 435 as an etching mask. Thus, floating gate 435 having the U-shaped cross section is formed. Floating gate 435 having the U-shaped cross section increases a coupling ratio between floating gate 435 and a dielectric layer, without increasing a cell area of the semiconductor memory device. Additionally, floating gate 435 is formed with a thin thickness as a result of the surface treatment.

Figure 8G:
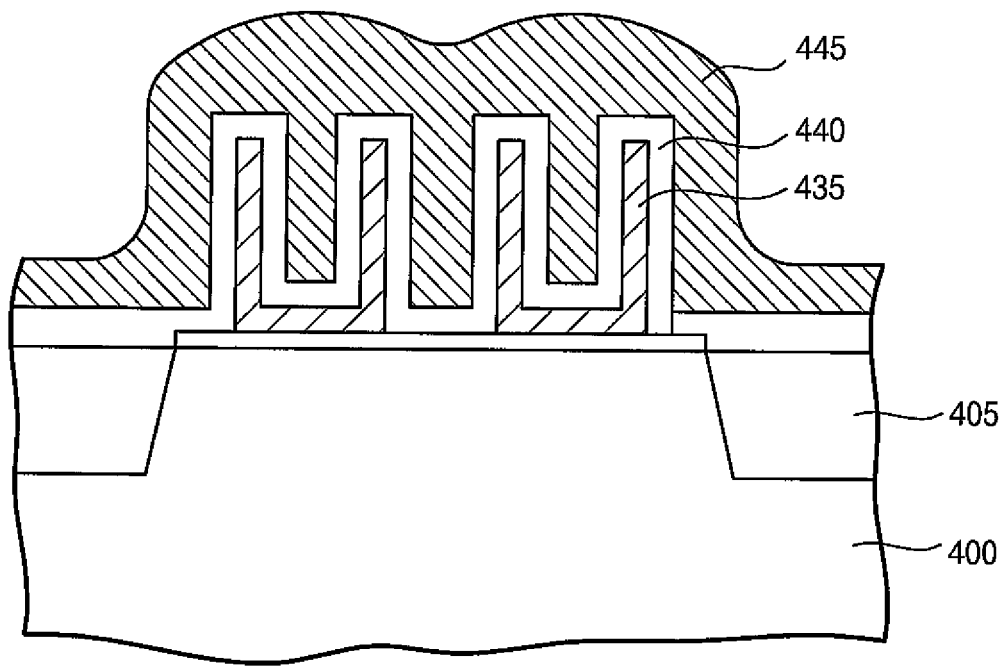

Referring to FIG. 8G, a dielectric layer 440 is formed on floating gate 435. Dielectric layer 440 may be formed by an ALD process using a high-k material. Dielectric layer 440 may be formed in a layered structure comprising an oxide layer, a nitride layer, and an oxide layer, successively formed. In another example embodiment of the invention, dielectric layer 440 is formed using a high-k material so that dielectric layer 440 has a thin EOT and a reduced leakage current. For example, dielectric layer 440 may be formed using hafnium oxide, zirconium oxide, tantalum oxide, aluminum oxide, titanium oxide, rubidium oxide, magnesium oxide, strontium oxide, boron oxide, lead oxide, or calcium oxide.

A control gate layer 445 is formed on dielectric layer 440. In an example embodiment of the present invention, control gate layer 445 is formed using polysilicon or a metal. In another example embodiment of the present invention, control gate layer 445 is formed in a polycide structure including a polysilicon layer and a metal silicide layer formed on the polysilicon layer. Control gate layer 445 is typically formed by a CVD process, an ALD process, or a sputtering process.

Dielectric layer 440 and control gate layer 445 are successively patterned to form a gate structure of a non-volatile semiconductor memory device. The gate structure includes a control gate, a dielectric layer pattern and floating gate 435.

FIGS. 9A through 9E are cross-sectional views illustrating a method of manufacturing a non-volatile semiconductor memory device in accordance with another embodiment of the present invention.

Figure 9A:
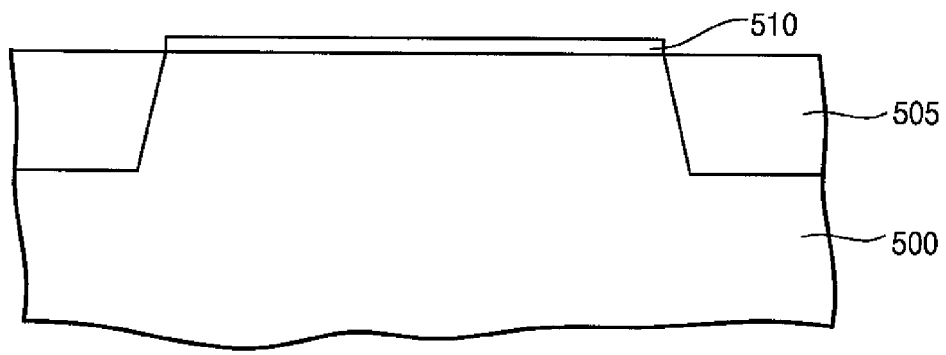
FIGS. 9A through 9E are cross-sectional views illustrating a method of manufacturing a non-volatile semiconductor memory device in accordance with another example embodiment of the present invention; and, FIGS. 10A through 10E are cross-sectional views illustrating a method of manufacturing a non-volatile semiconductor memory device in accordance with another example embodiment of the present invention.

Referring to FIG. 9A, an isolation layer 505 is formed on a substrate 500 by an isolation process such as a STI process or a LOCOS process to define an active region and a field region. Substrate 500 typically comprises a silicon wafer or a SOI substrate.

A gate oxide layer 510 is formed on substrate 500 over isolation layer 505. Gate oxide layer 510 is typically formed using silicon oxide. A thickness of gate oxide layer 510 is adjusted in accordance with a type of a semiconductor device. Gate oxide layer 510 is typically formed by a thermal oxidation process or a CVD process.

Substrate 500 including gate oxide layer 510 is treated with a solution including ozone. In an example embodiment of the present invention, the solution further includes de-ionized water. By a surface treatment using the solution including ozone, where a gate conductive layer is formed on gate oxide layer 510 using polysilicon or polysilicon germanium, a deposition rate of the gate conductive layer may be increased. In addition, uniformity and roughness of the gate conductive layer may be improved.

In an example embodiment of the present invention, the surface of gate oxide layer 510 may be treated with the solution including ozone having a concentration of about 30 ppm to about 300 ppm. Then, the solution including ozone is introduced onto the gate oxide layer 510 at a flow rate of about 2 L/min for about 60 seconds to about 600 seconds. A minimum effective concentration of ozone included in the solution is about 30 ppm. Where gate oxide layer 510 is treated by the solution including ozone having a concentration higher than about 300 ppm, there is no substantial difference in improved degree of a flow rate or a roughness of the gate oxide layer 510 according to an increase of an ozone concentration.

Figure 9B:
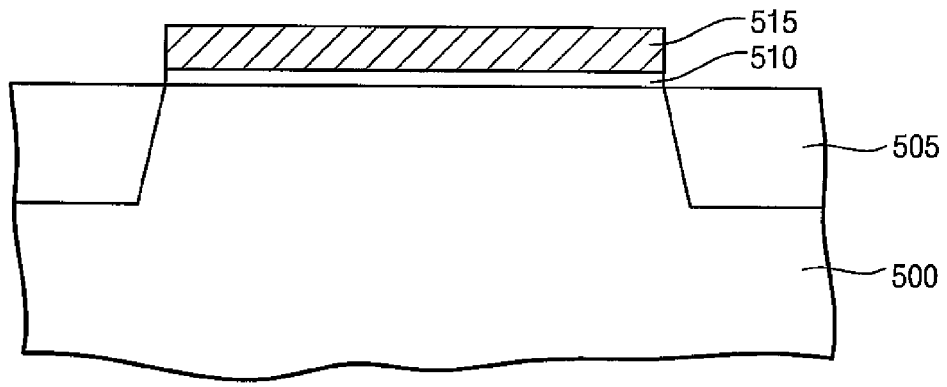

Referring to FIG. 9B, after the surface treatment for the gate oxide layer 510, a gate conductive layer 515 is conformally formed on gate oxide layer 510. Gate conductive layer 515 is typically formed using polysilicon. Gate conductive layer 515 is often formed in a polycide structure including a polysilicon layer and a metal silicide layer formed on the polysilicon layer. Gate conductive layer 515 may be patterned to form a gate conductive layer pattern. Conductive layer 425 may be formed by a CVD process, an LP-CVD process or an UHV-CVD process.

In some embodiments of the present invention, gate conductive layer 515 is formed using polysilicon doped with impurities. Where gate conductive layer 515 is formed using polysilicon doped with impurities, a gas including silicon, such as silane ($SiH_4$), disilane ($Si_2H_8$) or dichlorosilane ($SiCl_2H_2$), may be used as a source gas.

Figure 9C:
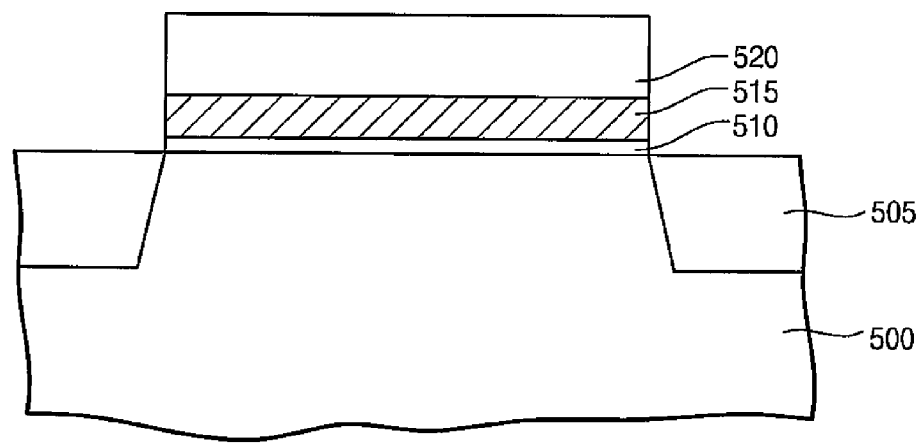

Referring to FIG. 9C, a mask layer 520 is formed on gate conductive layer 515. Mask layer 520 may be patterned to form a gate mask pattern. Mask layer 520 is typically formed using a material that has an etching selectivity relative to an insulating interlayer formed in a subsequent process. For example, the insulating interlayer is formed using an oxide, mask layer 520 is generally formed using a nitride such as silicon nitride.

Figure 9D:
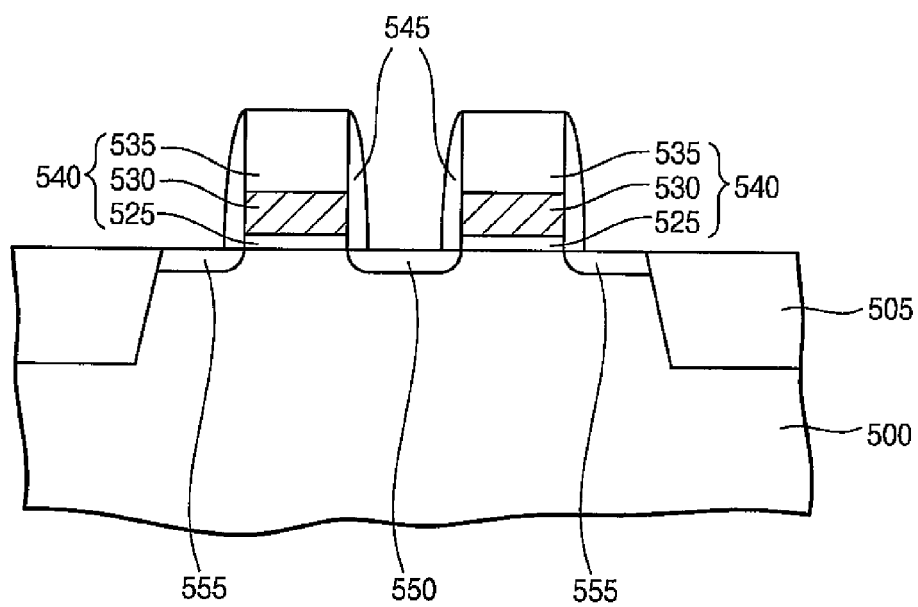

Referring to FIG. 9D, a photoresist film (not shown) is formed on mask layer 520. The photoresist film is exposed to a light and developed to form a photoresist pattern on mask layer 520. Mask layer 520, the gate conductive layer 515 and the gate oxide layer 510 are successively patterned using the photoresist pattern as an etching mask to form a gate structure 540 on the substrate 500. The gate structure 540 includes a gate oxide layer pattern 525, a gate conductive layer pattern 530 and a gate mask pattern 535.

In another embodiment of the invention, mask layer 520 is patterned using the photoresist pattern as an etching mask to form gate mask pattern 535 on gate conductive layer 515. Then, the photoresist pattern is removed by an ashing process and/or a stripping process.

Gate conductive layer 515 and gate oxide layer 510 are successively patterned using gate mask pattern 535 as an etching mask to form gate structure 540 including gate oxide layer pattern 525, gate conductive layer pattern 530 and gate mask pattern 535 on substrate 500.

An insulation layer is formed on the substrate having the gate structure formed thereon. The insulation layer is typically formed using a nitride such as silicon nitride. The insulation layer is anisotropically etched to form a spacer 545 on a sidewall of gate structure 540.

Impurities are implanted in a surface portion of substrate 500 exposed between gate structures 540 using gate structures 540 as an ion implantation mask to form a first contact region 550 and a second contact region 555. First contact region 550 and second contact region 555 are generally formed in substrate 500 by an ion implantation process and a thermal treatment process. Thus, transistors including gate structures 540 and first and second contact regions 550 and 555 are formed on substrate 500. For example, first contact region 550 may correspond to a source region and second contact region 555 may correspond to a drain region.

In an example embodiment of the present invention, first and second contact regions 550 and 555 are formed prior to forming spacer 545. In another example embodiment of the present invention, first and second contact regions 550 and 555 are formed after forming spacer 545.

Figure 9E:
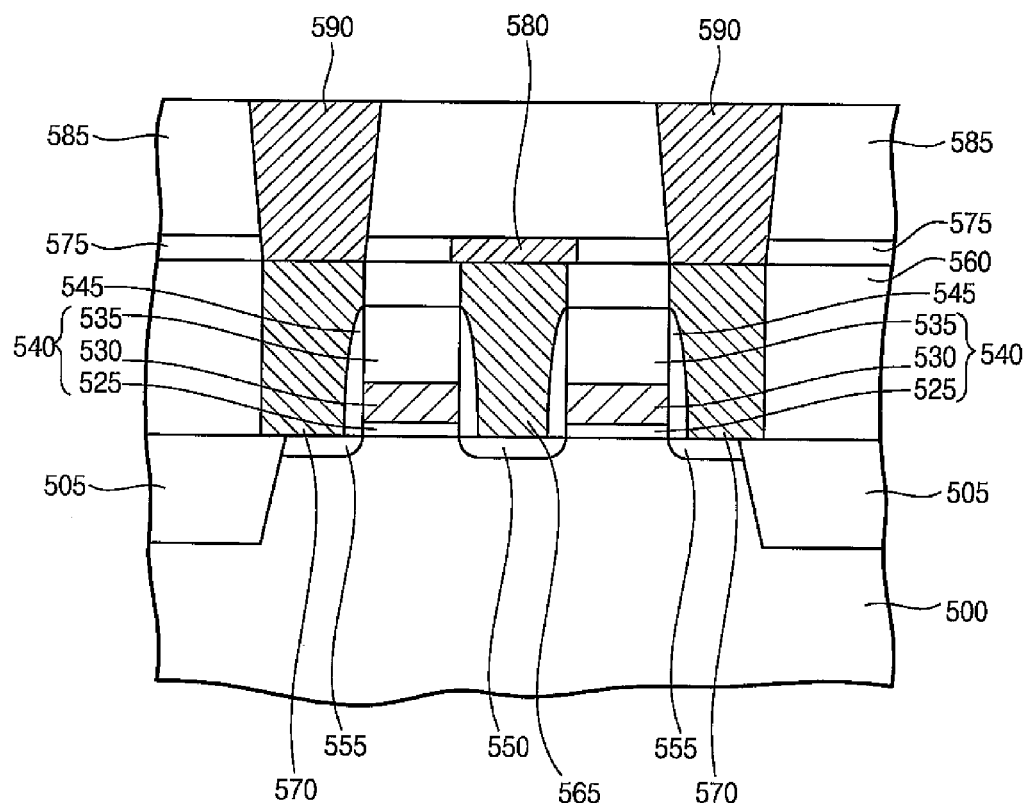

Referring to FIG. 9E, a first insulating interlayer 560 is formed on substrate 500 to cover gate structure 540. Hence, a first contact 565 and a second contact 570 are formed through first insulating interlayer 560. First and the second contacts 565 and 570 make contact with first and second contact regions 550 and 555, respectively. In one embodiment of the invention, first contact 565 is electrically connected with a bit line and second contact 570 is electrically connected with a capacitor.

A second insulating interlayer 575 is formed on first insulating interlayer 560. Second insulating interlayer 575 is partially etched to form a third contact 580 connected with first contact 565.

A third insulating interlayer 585 is formed on second insulating interlayer 575. Third and second insulating interlayers 585 and 575 are successively etched to form a fourth contact 590. Fourth contact 590 is connected with second contact 570 through the third and second insulating interlayers 585 and 575.

Devices such as a capacitor and an upper wiring may be further formed on third insulating interlayer 585.

FIGS. 10A through 10E are cross-sectional views illustrating a method of manufacturing a non-volatile semiconductor memory device in accordance with another example embodiment of the present invention.

Figure 10A:
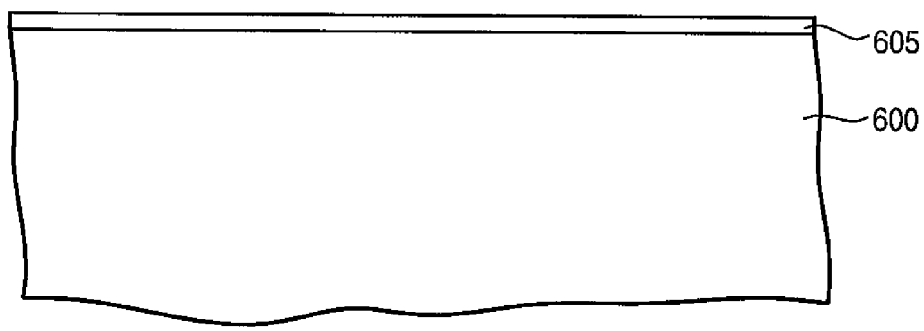

Referring to FIG. 10A, an isolation layer (not shown) is formed on a substrate 600 by an isolation process such as a STI process or a LOCOS process to define an active region and a field region. Substrate 600 typically comprises a silicon wafer or a SOI substrate.

A tunnel oxide layer 605 is formed on substrate 600. Tunnel oxide layer 605 is typically formed by a thermal oxidation process or a CVD process.

Substrate 600 including tunnel oxide layer 605 is treated with a solution including ozone. In some embodiments of the invention, the solution includes de-ionized water. The surface of tunnel oxide layer 605 is typically treated with the solution including ozone having a concentration of about 30 ppm to about 300 ppm. Then, the solution including ozone is generally introduced onto tunnel oxide layer 605 at a flow rate of about 2 L/min for about 60 seconds to about 600 seconds. A minimum effective concentration of ozone included in the solution may be about 30 ppm. By a surface treatment using the solution including ozone, when a floating gate layer is formed on the tunnel oxide layer 605 using polysilicon, a deposition rate of the floating gate layer may be increased. In addition, uniformity and roughness of the floating gate layer may be improved.

Figure 10B:
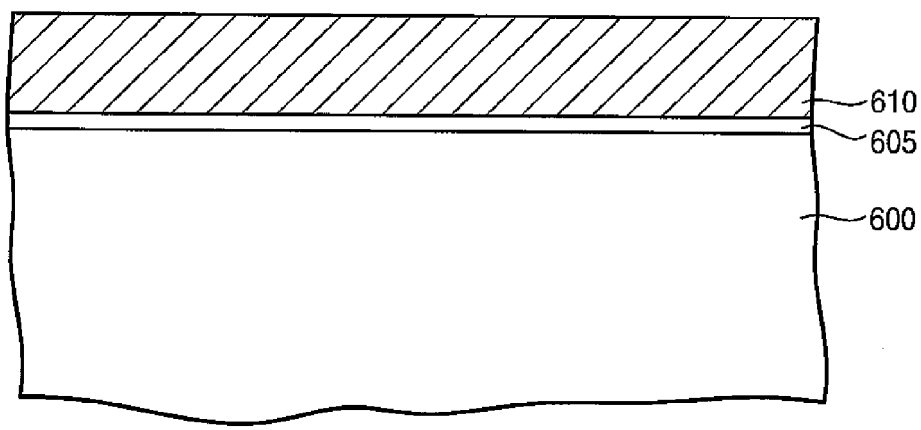

Referring to FIG. 10B, after the surface treatment for the tunnel oxide layer 605, a floating gate layer 610 is formed on tunnel oxide layer 605. In some embodiments of the invention, floating gate layer 610 comprises nano-crystalline silicon. Then, a source gas including silicon, such as silane ($SiH_4$), disilane ($Si_2H_8$) or dichlorosilane ($SiCl_2H_2$), is used to form floating gate layer 610. In other embodiments of the invention, floating gate layer 610 includes nano-crystalline silicon germanium. In such cases, a source gas including silicon germanium, such as silane and germane ($GeH_4$), may be used to form floating gate layer 610.

In some embodiments of the invention, floating gate layer 610 is formed by an UHV-CVD process, or a LP-CVD process. Where a hydroxyl group is formed on the surface of tunnel oxide layer 605 by the surface treatment, silicon nucleation is promoted. Therefore, floating gate layer 610 including the nano-crystalline particles having the required density is formed by the surface treatment performed on tunnel oxide layer 605. In addition, floating gate layer 610 is formed to have a more uniform thickness.

Figure 10C:
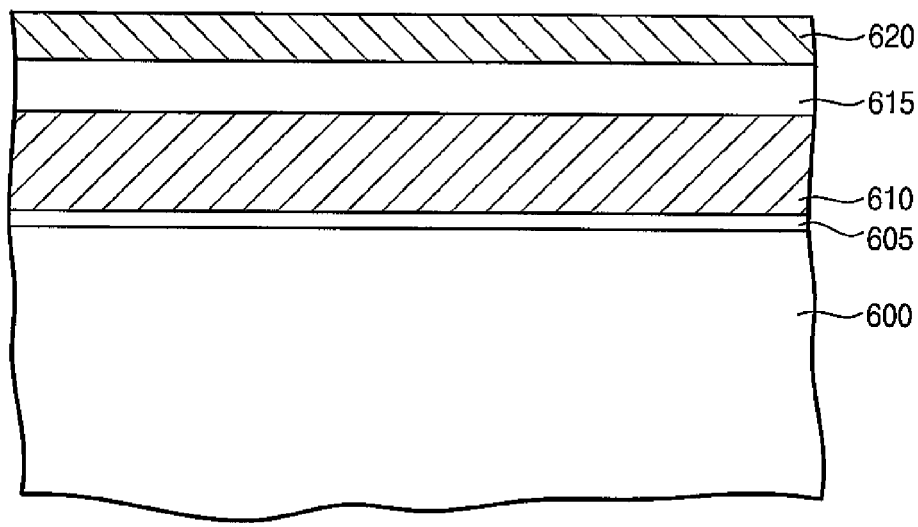

Referring to FIG. 10C, a dielectric layer 615 is formed on floating gate layer 610. Dielectric layer 615 is generally formed by an ALD process using a high-k material. In selected embodiments of the invention, dielectric layer 615 is formed in a structure comprising an oxide layer, a nitride layer, and an oxide layer, which are successively formed. In other embodiments, dielectric layer 615 is formed using a high-k material. For example, dielectric layer 615 may be formed using hafnium oxide, zirconium oxide, tantalum oxide, aluminum oxide, titanium oxide, rubidium oxide, magnesium oxide, strontium oxide, boron oxide, lead oxide, or calcium oxide.

A control gate layer 620 is formed on dielectric layer 615. In some embodiments of the invention, control gate layer 620 is formed using polysilicon or a metal. In other embodiments, control gate layer 620 is formed in a polycide structure including a polysilicon layer and a metal silicide layer. Control gate layer 620 is typically formed by a CVD process, an ALD process, or a sputtering process.

Figure 10D:
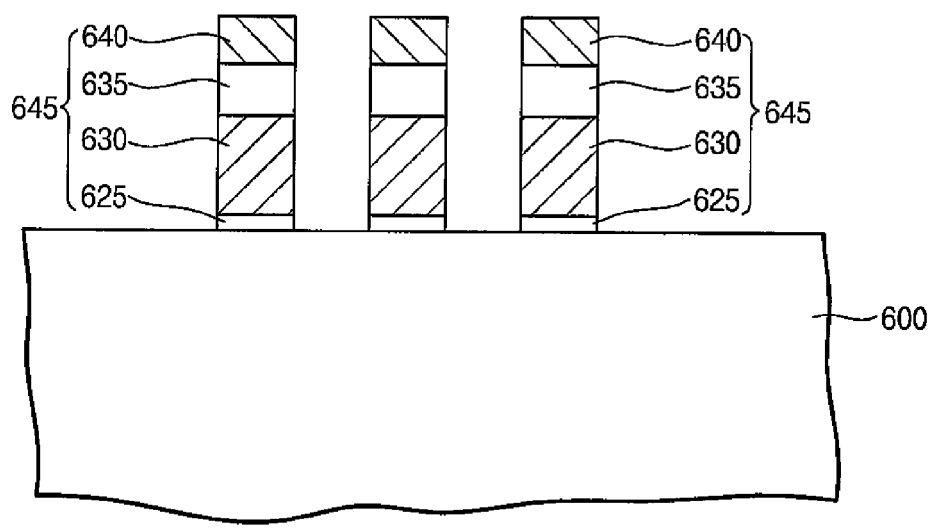

Referring to FIG. 10D, a hard mask (not shown) is formed on over control gate layer 620. Control gate layer 620, dielectric layer 615, floating gate layer 610 and tunnel oxide layer 605 are successively patterned using the hard mask as an etching mask to form a gate structure 645. Gate structure 645 includes a tunnel oxide layer pattern 625, a floating gate 630, a dielectric layer pattern 635 and a control gate 640. Gate structure 645 stores data by trapping a charge in an interface betweens the nano-crystalline particles in floating gate 630.

Figure 10E:
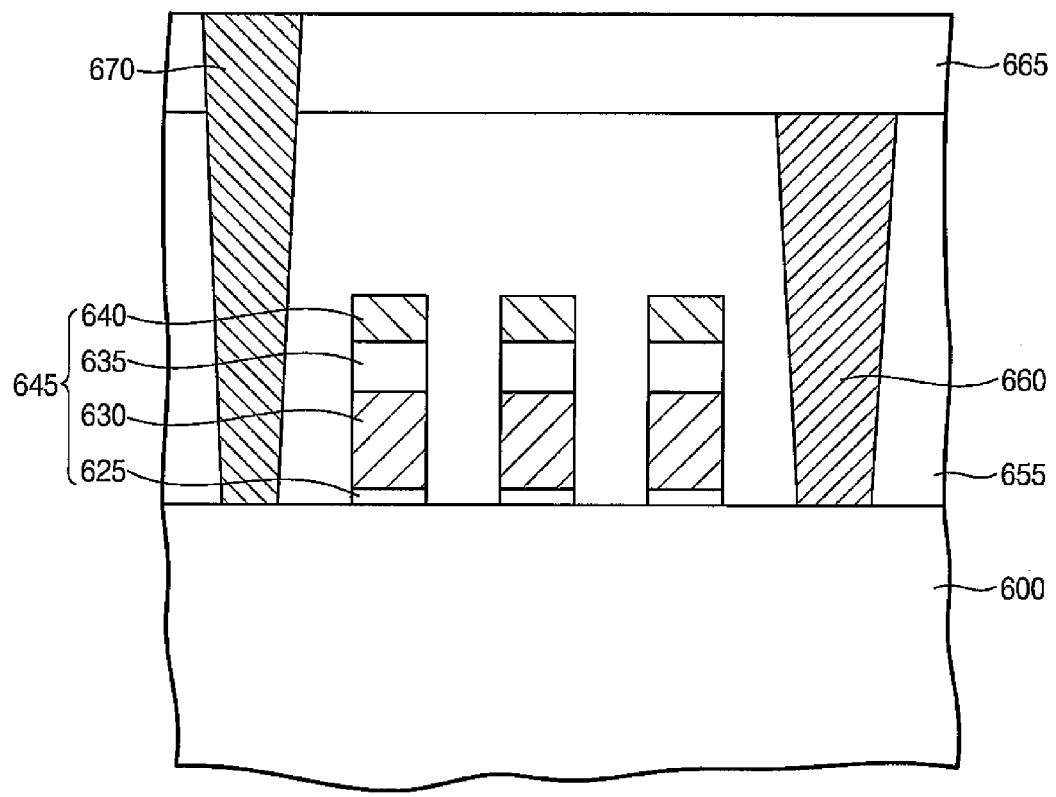

Referring to FIG. 10E, impurities are implanted in a surface portion of substrate 600 exposed between gate structures 645 using gate structures 645 as an ion implantation mask to form source and drain regions.

A first insulating interlayer 655 is formed on substrate 600 to cover gate structure 645. First insulating interlayer 655 is typically formed using an oxide such as BPSG, PSG, USG, SOG, FOX, PE-TEOS, or HDP-CVD oxide. In addition, first insulating interlayer 655 may be formed by a CVD process, a PE-CVD process, an ALD process, or an HDP-CVD process.

First insulating interlayer 655 is partially etched by a lithography process to form a first contact 660. First contact 660 makes contact with the active region between gate structures 645 of adjacent transistors. First contact 660 is typically formed using a metal or a conductive metal nitride. For example, first contact 660 is may be formed using tungsten, aluminum, tantalum, copper, titanium nitride, tantalum nitride, or titanium aluminum nitride.

A second insulating interlayer 665 is formed on first insulating interlayer 655 and first contact 660. A second contact 670 connected with the active region of substrate 600 is formed through second and first insulating interlayers 665 and 655. Second contact 670 may be formed using polysilicon, or a metal. A bit line (not shown) electrically connected with second contact 670 is formed on second insulating interlayer 665.

According to various embodiments of the present invention, when a conductive layer using silicon or silicon germanium is formed on an oxide layer, the conductive layer is formed after treating the oxide layer with a solution including ozone. By performing the surface treatment using the solution including ozone, the conductive layer is formed having with a thin and uniform thickness. In addition, since an initial deposition time of silicon is reduced, the conductive layer having a desired thickness may be formed for a short time. Therefore, a thin conductive layer having a thickness of about 100 Å is formed uniformly, so that a semiconductor device may be operated reliably at a low voltage. Additionally, when a floating gate including nano-crystalline particles is formed in a non-volatile memory device, a formation of the nano-crystalline particles may be promoted by the surface treatment using the solution including ozone for a tunnel oxide layer. Thus, the floating gate including the nano-crystalline particles having a high density may be formed, so that the non-volatile semiconductor memory device may have improved stability.

The foregoing preferred embodiments are teaching examples. Those of ordinary skill in the art will understand that various changes in form and details may be made to the example embodiments without departing from the scope of the present invention as defined by the following claims.

What is claimed is:

1. A method of manufacturing a non-volatile memory device, the method comprising:
   forming a tunnel oxide layer of silicon oxide, at an upper surface of a substrate, by a thermal oxidation or CVD (chemical vapor deposition) process;
   forming a floating gate layer, including nano-crystalline particles comprising silicon, on the tunnel oxide layer using a deposition process employing source gas including silicon and hydrogen atoms; and
   prior to the forming of the floating gate layer by the deposition process, treating the tunnel oxide layer to promote the rate of crystallization and growth of silicon forming the nano-crystalline particles during the deposition process of forming of the floating gate layer, wherein the treating comprises wetting the tunnel oxide layer which has been formed by said thermal oxidation or CVD process with a solution comprising ozone and de-ionized water to form hydroxyls on a surface of the tunnel oxide layer.

2. The method of claim 1, further comprising:
   forming a dielectric layer on the floating gate layer;
   forming a control gate layer on the dielectric layer; and
   forming a control gate, a dielectric layer pattern, a floating gate, and a tunnel oxide layer pattern by patterning the control gate layer, the dielectric layer, the floating gate layer and the tunnel oxide layer.

3. The method of claim 1, wherein the forming of the floating gate layer comprises forming particles of nano-crystalline silicon or nano-crystalline silicon germanium.

4. The method of claim 1, wherein the concentration of ozone in the solution is in a range between about 30 ppm and about 300 ppm.

5. The method of claim 1, wherein the deposition process promoted by the treating of the floating gate layer forms the nano-crystalline particles at a density in a range of about $10^{12}/cm^2$ to about $10^{13}/cm^2$ in the floating gate layer.

6. The method of claim 1, wherein the deposition process is carried out for a period of time in a range of about 10 to 30 seconds.

7. The method of claim 1, wherein the tunnel oxide layer of silicon oxide is formed by a thermal oxidation process in an atmosphere containing oxygen or water vapor.

8. A method of manufacturing a non-volatile memory device, the method comprising:
   forming a tunnel oxide layer of silicon oxide, at an upper surface of a substrate, by a thermal oxidation or CVD (chemical vapor deposition) process;
   treating the tunnel oxide layer, which has been formed by the thermal oxidation or CVD process, by introducing a solution, comprising ozone and de-ionized water, onto a surface of the tunnel oxide layer, to form hydroxyls on the surface of the tunnel oxide layer, wherein the concentration of ozone in the solution is in a range between about 30 ppm and about 300 ppm, and the solution is introduced onto the surface of the tunnel oxide layer at a flow rate of about 2 L/m for a period of time of about 60 seconds to about 600 seconds,
   subsequently forming a floating gate layer, including nano-crystalline particles comprising silicon at a density in a range of about $10^{12}/cm^2$ to about $10^{13}/cm^2$ in the floating gate layer, on the treated tunnel oxide layer using a deposition process employing source gas including silicon and hydrogen atoms, whereby the rate of crystallization and growth of silicon forming the nano-crystalline particles in the deposition process of forming the floating gate layer is promoted by the hydroxyls formed on the surface of the tunnel oxide layer.

9. The method of claim 8, further comprising:
   forming a dielectric layer on the floating gate layer;
   forming a control gate layer on the dielectric layer; and
   forming a control gate, a dielectric layer pattern, a floating gate, and a tunnel oxide layer pattern by patterning the control gate layer, the dielectric layer, the floating gate layer and the tunnel oxide layer.

10. The method of claim 8, wherein the forming of the floating gate layer comprises forming particles of nano-crystalline silicon or nano-crystalline silicon germanium.

11. The method of claim 8, wherein the tunnel oxide layer of silicon oxide is formed by a thermal oxidation process in an atmosphere containing oxygen or water vapor.

12. A method of manufacturing a non-volatile memory device, the method comprising:
   forming a tunnel oxide layer of silicon oxide, at an upper surface of a substrate, as a direct result of a thermal oxidation or CVD (chemical vapor deposition) process;
   forming a floating gate layer, including nano-crystalline particles comprising silicon, on the tunnel oxide layer using a deposition process employing source gas including silicon and hydrogen atoms; and
   subsequent to the thermal oxidation or CVD process and prior to any other deposition process, treating the tunnel oxide layer formed by the thermal oxidation or CVD process to promote the rate of crystallization and growth of silicon forming the nano-crystalline particles during the forming of the floating gate layer, wherein the treating comprises wetting the tunnel oxide layer directly at the end of the thermal oxidation or CVD process with a solution comprising ozone and de-ionized water to form hydroxyls on a surface of the tunnel oxide layer.

13. The method of claim 12, further comprising:
forming a dielectric layer on the floating gate layer;
forming a control gate layer on the dielectric layer; and
forming a control gate, a dielectric layer pattern, a floating gate, and a tunnel oxide layer pattern by patterning the control gate layer, the dielectric layer, the floating gate layer and the tunnel oxide layer.

14. The method of claim 12, wherein the concentration of ozone in the solution is in a range between about 30 ppm and about 300 ppm, and the solution is introduced onto the surface of the tunnel oxide layer at a flow rate of about 2 L/m for a period of time of about 60 seconds to about 600 seconds, and
the forming of the floating gate layer on the tunnel oxide layer comprises forming the nano-crystalline particles comprising silicon at a density in a range of about $10^{12}/cm^2$ to about $10^{13}/cm^2$ in the floating gate layer by a deposition process employing source gas including silicon and hydrogen atoms.

15. The method of claim 12, wherein the forming of the floating gate layer comprises forming particles of nano-crystalline silicon or nano-crystalline silicon germanium.

16. The method of claim 12, wherein the tunnel oxide layer of silicon oxide is formed by a thermal oxidation process in an atmosphere containing oxygen or water vapor.

* * * * *